(12) United States Patent
Miyazaki

(10) Patent No.: US 8,976,912 B1
(45) Date of Patent: Mar. 10, 2015

(54) DECODING APPARATUS AND DECODING METHOD

(71) Applicant: Fujitsu Limited, Kawasaki-shi, Kanagawa (JP)

(72) Inventor: Shunji Miyazaki, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 14/460,674

(22) Filed: Aug. 15, 2014

(30) Foreign Application Priority Data

Aug. 19, 2013 (JP) .................................. 2013-169976

(51) Int. Cl.
*H04L 27/06* (2006.01)
*H04L 1/00* (2006.01)

(52) U.S. Cl.
CPC .................................... *H04L 1/0054* (2013.01)
USPC ............................ 375/341; 375/340; 375/324

(58) Field of Classification Search
USPC ......................................... 375/341, 340, 324
See application file for complete search history.

(56) References Cited

U.S. PATENT DOCUMENTS

| | | | | |
|---|---|---|---|---|
| 7,222,288 B2* | 5/2007 | Varma et al. | .................. | 714/795 |
| 7,237,180 B1* | 6/2007 | Shao et al. | .................. | 714/778 |
| 7,246,298 B2* | 7/2007 | Chiueh et al. | .................. | 714/755 |
| 8,509,359 B2* | 8/2013 | Kelin et al. | .................. | 375/341 |
| 2006/0161834 A1 | 7/2006 | Saito et al. | | |
| 2007/0168843 A1 | 7/2007 | Kanaoka et al. | | |
| 2008/0109710 A1* | 5/2008 | Takanashi | .................. | 714/799 |
| 2010/0169745 A1 | 7/2010 | Motozuka | | |

FOREIGN PATENT DOCUMENTS

| | | |
|---|---|---|
| JP | 2006-197422 | 7/2006 |
| JP | 2007-164923 | 6/2007 |
| JP | 2010-239491 | 10/2010 |
| WO | 2008/023682 | 2/2008 |

OTHER PUBLICATIONS

J. Hagenauer, et al., "A Viterbi algorithm with Soft-Decision and Outputs and its Applications", German Aerospace Research Establishment (DLR), Institute for Communications Technology, GLOBECOM '89, vol. 3, pp. 1680-1686.

Lay-Hong Ang et al., "Modification of SOVA-based Algorithms for Efficient Hardware Implementation", in Proceedings of IEEE 71st Vehicular Technology Conference, Taipei, (2010) pp. 1-5.

* cited by examiner

*Primary Examiner* — Kabir A Timory
(74) *Attorney, Agent, or Firm* — Fujitsu Patent Center

(57) ABSTRACT

A decoding apparatus including an operation unit to calculate a branch metric between first and second instants of time based on receiving likelihood data and an anterior likelihood, and to use, in a state transition in a butterfly represented by first and second states at the first instant of time and third and fourth states at the second instant of time, a first anterior cumulative metric for the first state, a second anterior cumulative metric for the second state and a first difference based on the branch metric between the first state and the third state and on a second difference between the first anterior cumulative metric and the second anterior cumulative metric to calculate a third anterior cumulative metric for the third state and a fourth anterior cumulative metric for each butterfly and at each instant of time, and a storage unit to store the second difference.

12 Claims, 19 Drawing Sheets

FIG. 1

| ITEM | | PARAMETER |
|---|---|---|
| INFORMATION BIT SIZE | | K=64-6144 (VARIABLE) |
| SIGN BIT SIZE | | N=3×K+12 |
| ENCODING RATE (NOMINAL FOR A CASE WHERE 12 BITS FOR TERMINATION ARE NOT INCLUDED) | | 1/3 |
| ENCODING RATE (FOR A CASE WHERE BITS FOR TERMINATION ARE INCLUDED) | | K/(3×K+12) |
| ELEMENT CODE | | 1/2 RECURSIVE CONVOLUTIONAL CODE |
| | DELAY MEMORY SIZE | m |
| | CONSTRAINT LENGTH | m+1 |
| | TRELLIS BOUNDARY CONDITION — START | 0 |
| | TRELLIS BOUNDARY CONDITION — TERMINATION | 0 |
| | INTERLEAVER (IL) | QPP |

DECODING APPARATUS AND DECODING METHOD

CROSS-REFERENCE TO RELATED APPLICATION

This application is based upon and claims the benefit of priority of the prior Japanese Patent Application No. 2013-169976, filed on Aug. 19, 2013, the entire contents of which are incorporated herein by reference.

FIELD

The embodiments described herein are related to a decoding apparatus and a decoding method.

BACKGROUND

In a digital communication system, a transmitting apparatus performs error detection encoding processes and error correction encoding processes to digital data.

Further, the digital communication system performs digital modulations to the data and outputs the data to the propagation path.

Since the data are affected by noise etc. on the propagation path, the data signals are distorted.

The receiving apparatus receives the signals from the transmitting apparatus via the propagation path, demodulates the received signals, generates likelihood data according to the signal level and decodes the generated data to obtain the original digital data.

Patent Document

[Patent document 1] Japanese Laid-Open Patent Publication No. 2010-239491
[Patent document 2] Japanese Laid-Open Patent Publication No. 2006-197422
[Patent document 3] Japanese Laid-Open Patent Publication No. 2007-164923

Non-Patent Document

[Non-patent document 1] J. Hagenauer and P. Hoeher, "AViterbi algorithm with soft-decision outputs and its applications," in Proc.GLOBECOM'89, vol. 3, Dallas, Tex., November 1989, pp. 1680-1686.
[Non-patent document 2] L. Ang, W. Lim, and M. Kamuf, "Modification of SOYA-based algorithms for efficient hardware implementation," in Proceedings of IEEE 71st Vehicular Technology Conference, Taipei, May 16-19, 2010: 1-5.

SUMMARY

According to one embodiment, it is provided a decoding apparatus to calculate a posterior likelihood at each instant of time between a starting time and an end time, the decoding apparatus including an operation unit to calculate a branch metric for a branch between a first instant of time and a second instant of time subsequent to the first instant of time based on receiving likelihood data and an anterior likelihood, and to use, in a state transition in a butterfly represented by a first state and a second state at the first instant of time and a third state and a fourth state at the second instant of time, a first anterior cumulative metric for the first state, a second anterior cumulative metric for the second state and a first difference based on the branch metric between the first state at the first instant of time and the third state at the second instant of time and on a second difference between the first anterior cumulative metric for the first state and the second anterior cumulative metric for the second state to calculate a third anterior cumulative metric for the third state and a fourth anterior cumulative metric for each butterfly and at each instant of time, and a storage unit to store the second difference for each butterfly and at each instant of time.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 1 is a diagram illustrating an example of the definition of 3GPP turbo coding.

DESCRIPTION OF EMBODIMENTS

Figure 2:
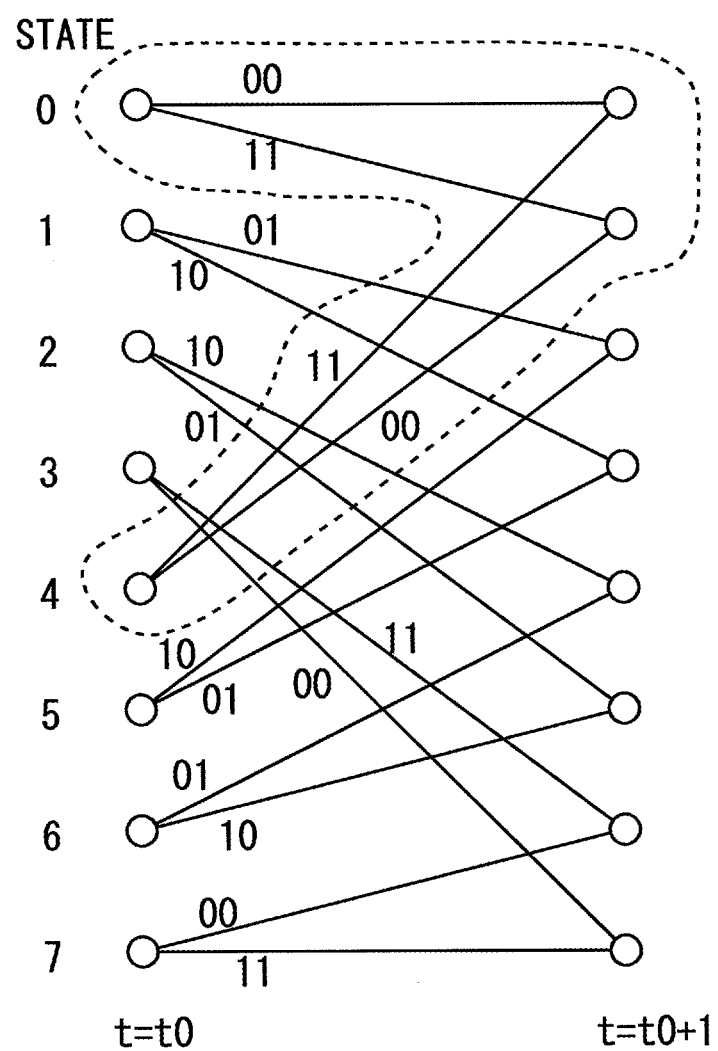
FIG. 2 is a diagram illustrating an example of a trellis section.

The receiving apparatus uses likelihood data and repeats operations performed by an element decoder to obtain output data, namely original digital data. It is aimed to obtain data with preferable properties. However, it is general that the amount of processes performed by the element decoder increases for obtaining data with such preferable properties. On the contrary, when the amount of operations performed by the element decoder is decreased, the properties of obtained data will deteriorate. It is an object according to the embodiments disclosed herein to reduce the deterioration of data characteristics and decrease the amount of decoding processes. The embodiments are described below with reference to the drawings. Since the configurations described in the embodiments are merely examples, the configurations disclosed herein are not limited to the specific configurations in the embodiments below. It is appreciated that specific configurations according to the embodiments can arbitrarily be chosen when the configurations disclosed herein are employed.

It is assumed here that LTE (Long Term Evolution) of 3GPP (3rd Generation Partnership Project) is employed as a communication system in the embodiments. However, the embodiments described herein are not limited to LTE of 3GPP but can be applied to other communication systems.

(Encoding/Decoding Processes)

Encoding used in the 3GPP mobile communication system is described as a specific example of turbo encoding and turbo decoding. However, the embodiments are not limited to this type of coding. The present embodiments can be applied to decoding processes in which trellis codes are employed as element codes and SISO (Soft In Soft Out) type decoders are used for corresponding element decoding processes. Here, the SISO type decoder is a decoder which outputs a posterior likelihood for each bit of a transmission bit sequence by use of an input likelihood based on the MAP operation principle.

(Encoding)

FIG. 1 illustrates a diagram of an example of the definition of the turbo coding of 3GPP. The turbo coding defined as the encoding scheme of data channel in 3GPP is a turbo coding with a standard code rate of ⅓. The turbo coding employs two element encoders and an interleaver (IL) which relates the encoders to each other. The element code is a recursive convolutional code with a code rate of ½.

A generating polynomial of an element code is defined as follows.

$$G(D)=[1,g_1(D)/g_0(D)]$$

Here, the following formulas are defined.

$$g_0(D)=1+D^2+D^3$$

$$g_1(D)=1+D+D^3$$

The order of the polynomial corresponds to the size of a delay memory (m=3).

Trellis Termination is used as a terminating method of coding. In Trellis Termination, the last value in the delay memory is set to 0 by inputting tail bits with the same number of the delay memory after the last information bit is input.

The turbo codes used in the present embodiment is not limited to the example as illustrated in FIG. 1.

(Decoding)

The decoding processes for turbo codes are "repetitive decoding processes" in which element decoding processes are repeatedly performed. The element decoder performs decoding processes corresponding to each of the two element encoders. As for convolutional codes, MAP (Maximum A posteriori Probability) scheme is used as a method of performing estimation per information bit. However, when the MAP scheme is implemented without modification, the design cost of the hardware in the scheme becomes large.

Thus, the scheme is modified according to the implementation. For example, "Max-Log-MAP scheme" and "SOYA (Soft Output Viterbi Algorithm) scheme" are known as such modified schemes.

The state, namely the state of the delay memory corresponds to the value of the delay register memory used for the convolutional codes. When the size of the delay memory is 3 (m=3), the number of states is 8 by the cube of 2.

The state of the memory before an information bit is input at a given time is the initial state. And, the state after the state transits from the initial state to another state due to the input of the information bit is the end state. The relation between the initial state $s_i$ and the end state $s_e$ is referred to as "branch". The branch between the initial state $s_i$ and the end state $s_e$ is expressed by $(s_i, s_e)$.

The trellis section graphically represents how the value (state) in the delay memory changes and how a local code are output when an information bit is input at a given time.

FIG. 2 is a diagram illustrating an example of trellis section. As illustrated in FIG. 2, in the trellis section, a different state at each given time is aligned in the vertical direction and the states to which the aligned states can transit at the time next to the given time are connected with "branches". The horizontal direction in FIG. 2 represents time. In the example as illustrated in FIG. 2, the states at the time t=t0 are aligned and each state at the time t=t0 is connected by branches with the states at the time t=t0+1 to which the states at the time t=t0 can transit.

A trellis diagram is a graph in which trellis section is aligned in the time sequence. The number of trellis sections corresponds to the number of information bit sequences, namely the number of information bits.

Figure 3:
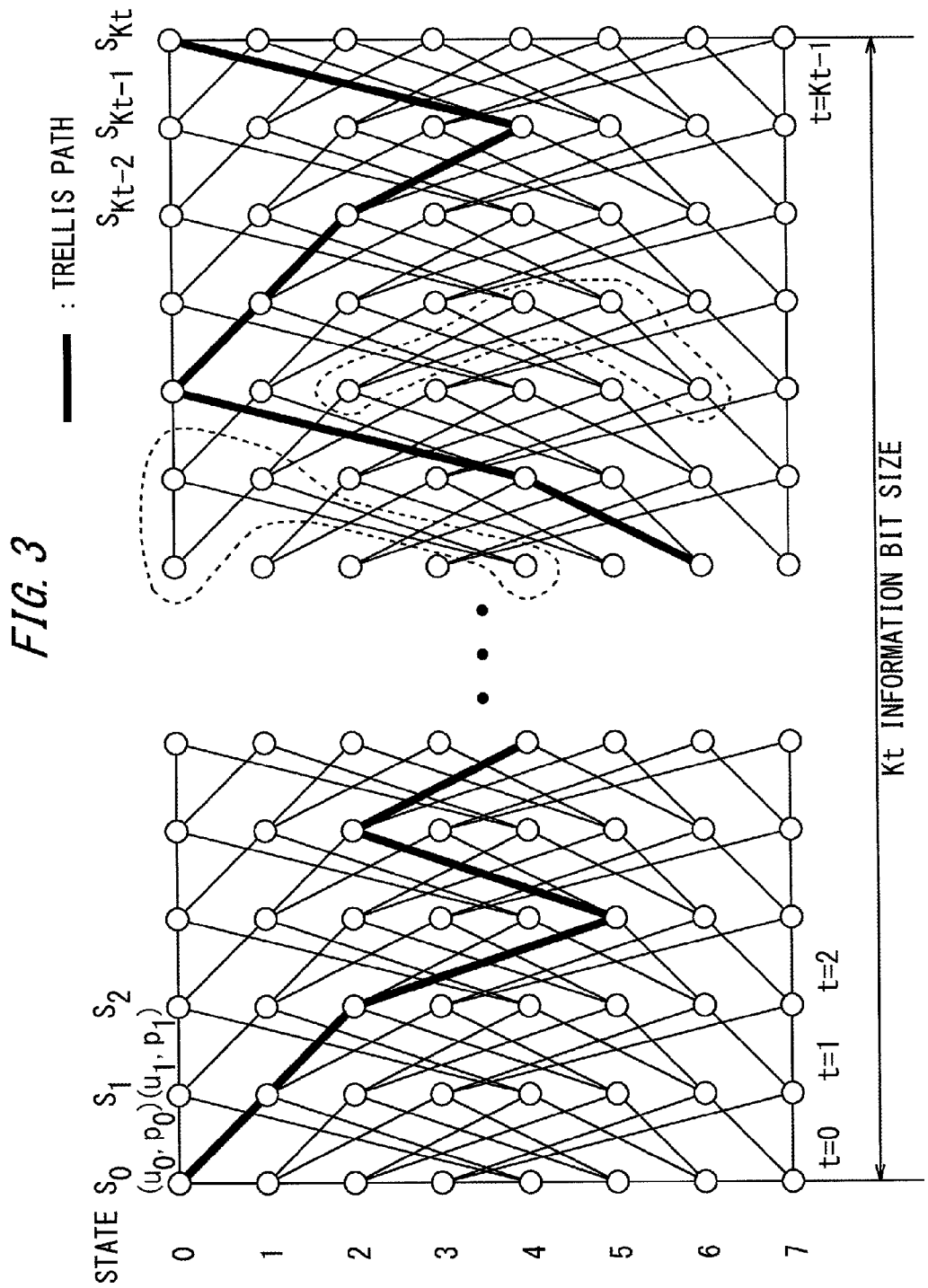
FIG. 3 is a diagram illustrating an example of a trellis diagram.

FIG. 3 illustrates a diagram of an example of a trellis diagram. In FIG. 3, the horizontal axis represents time and the vertical axis represents the states of the delay memory. The state of the delay memory is set to be 0 both at the start time and at the end time. Any information bit sequence starts with the state 0 at the start time, goes through one of branches with the state 0 or 1 and ends with the state 0. A trellis path, hereinafter occasionally referred to as "path", is a connection of the branches. Each trellis path corresponds to a different possible codeword. In FIG. 3, an example of a trellis path is illustrated with a bold broken line.

Generally, a route which transits from a state at a given time to a state at another given time is also referred to as "path". Therefore, one of the brunches as described above is one of the paths.

When two paths originate from a state, one path is referred to as "path" and the other path is referred to as "rival path". Similarly, when two paths reach a state, one path is referred to as "path" and the other path is referred to as "rival path".

As illustrated in FIG. 2, the sign bits on a path and the rival path are the values of "inverted bit" with respect to each other.

α operation is an operation for calculating the maximum value and the minimum value in an cumulative metric for a path starting from the start time and reaching a state at a given time after the start time. β operation is an operation for calculating the maximum value and the minimum value in an cumulative metric for a path from the end time and reaching a state at a given time before the end time.

When the α operation is performed, in the selection of the maximum value or the minimum value in the cumulative metric, a selected path is referred to as "winning path" and the other path is referred to as "losing path". The two candidate paths are paths which have been selected as winning paths before the paths reach the respective states at the preceding time. That is, the two candidate paths are winning paths in the respective states at the preceding time. Therefore, the "losing path" is a path which has been winning before the preceding time and is selected as losing path at the preceding time. In β operations, the similar definition as described above can be applied with the time direction inverted.

It depends on the positive and negative of the coefficient when a branch metric is generated based on the input likelihood to determine which of the maximum value and the minimum value corresponds to the optimal metric. When the maximum value corresponds to the optimal metric, the case is referred to as "max rule". And when the minimum value corresponds to the optimal metric, the case is referred to as "min rule".

When the bit values are inverted for the unit $u \in \{0, 1\}$, the unit represented by uc=1−u. And each bit value $\{0, 1\}$ corresponds to the value $\{+1, -1\}$ under the following rule.
$\{0,1\} \Leftrightarrow \{+1,-1\}$
The equations are as follows by representing the amplitude symbol to the bit u by $\bar{u}$.

$$\bar{u} = (-1)^u = 1 - 2u$$
$$u = \frac{1 - \bar{u}}{2}$$

The amplitude symbol to the bit p (bar over p) is represented in a similar manner.

When the bit size of the codewords of information bits with the size K is represented by N, the likelihood data sequence of a receiving signal is interpreted as a point in the N-dimensional real Euclidean space. When there is not a noise, the codewords are represented by $2^K$ different points in the Euclidean space. Noise data is added to the receiving data and the receiving data is represented as a point different from the codeword. The maximum likelihood decoding is estimating that the closest point of a codeword to this receiving data is the transmitted encoding bit sequence. The fundamental rule is that the Euclidean distance between codewords are referred to as "metric". However, the resultant distance depends on the magnitude relationship of the metric for each codeword under the above encoding principle. Thus, the "metric" can be redefined as the distance obtained by subtracting or adding a common distance for each metric for codeword from the Euclidean distance. In addition, in the Max-Log-MAP scheme, the result does not change even by scaling the Euclidean distance with a common coefficient for the whole metric. Thus, the "metric" can also be redefined as the distance obtained by scaling with a coefficient.

Path metric is a metric for codewords corresponding to trellis paths. Since the metric is defined by Euclidean distance, the metric is represented by the sum of square of the distance between the bits.

Branch metric is a metric limited to local codes corresponding to the brunches in the trellis metric.

(Max-Log-MAP Scheme)

The Max-Log-MAP scheme is described below. In the Max-Log-MAP scheme, Viterbi operations are performed on the trellis diagram to calculate the path metric.

First, the path metric for each trellis path is calculated. A path metric for a path which goes through a branch at a given time is determined as the sum of an anterior cumulative metric α for the state at the starting point of the branch, a posterior cumulative metric β for the state at the end point of the branch and a branch metric. The anterior cumulative metric α for the state at the starting point of the branch is the sum of branch metrics from the state at the start time to the state at the starting point of the branch. The posterior cumulative metric β for the state at the end point of the branch is the sum of branch metrics from the state at the end time to the state at the end point of the branch. It is noted here that the max rule is employed for calculating the cumulative metrics.

When the state transits from the state s to the state s' at the time t=i, the branch metric γ is represented as follows.

$$g_i(u,p) = \bar{u} \cdot y_s(i) + \bar{p} \cdot y_p(i) + \bar{u} \cdot L_e(i) u, p \in \{0,1\}, \bar{u}, \bar{p} \in \{+1,-1\}$$

$$\gamma_i(s,s') = g_i(u,p)$$

It is noted that (u, p) denotes a local code corresponding to a branch B (s, s'). And $y_s$ and $y_p$ respectively denote receiving likelihood (likelihood data). In addition, $L_e$ denotes a posterior likelihood in the preceding operation.

The anterior cumulative metric α for the state s at the time t=i+1 is calculated by the following method. It is assumed here that the states $s_0$ and $s_1$ at the time t=i transits to the state s at the time t=i+1 on the trellis diagram.

$$\alpha_{i+1}(s) = \max(\alpha_i(s_0) + \gamma_i(s_0, s), \alpha_i(s_1) + \gamma_i(s_1, s))$$

It is noted that A denotes the addition of an anterior cumulative metric for the state $s_0$ at the time t=i and a branch metric when the state transits from the state $s_0$ to the state s at the time t=i. Similarly, B denotes the addition of an anterior cumulative metric for the state $s_1$ at the time t=i and a branch metric when the state transits from the state $s_1$ to the state s at the time t=i. The anterior cumulative metric α for the state s at the time t=i+1 is a value whichever is greater between the value A and B. It is noted that anterior cumulative metrics α are calculated in ascending order from i=0 to i=Kt−1.

Figure 4:
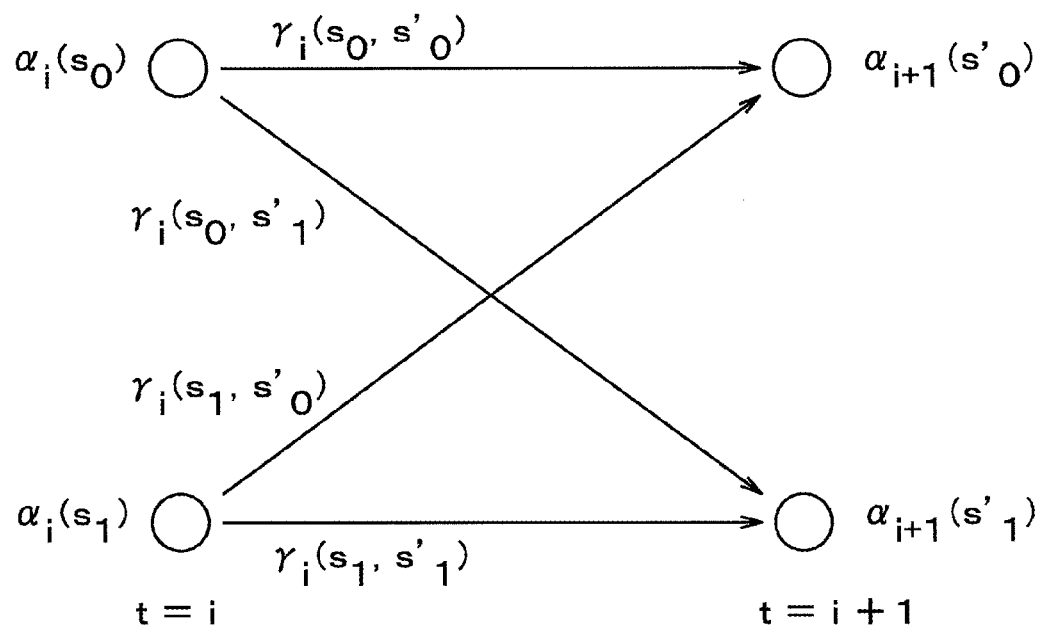
FIG. 4 is a diagram illustrating a relation between an anterior cumulative metric $\alpha$ and a branch metric $\gamma$.

FIG. 4 is a diagram illustrating the relations between anterior cumulative metrics α and branch metrics γ. In FIG. 4, each white circle represents a state. FIG. 4 illustrates the state $s_0$ and the state $s_1$ at the time t=i and the state s' and the state $s'_1$ at the time t=i+1. The anterior cumulative metric α at the current time is calculated by using the anterior cumulative metric and the branch metric at the preceding time. Each anterior cumulative metric α is stored and used for calculating the posterior likelihood L.

The posterior cumulative metric β for the state s at the time t=i is calculated as follows.

$$\beta_i(s) = \max(\beta_{i+1}(s'_0) + \gamma_i(s, s'_0), \beta_{i+1}(s'_1) + \gamma_i(s, s'_1))$$

It is noted that the posterior cumulative metrics β are calculated in descending order from i=Kt−1 to i=0.

Figure 5:
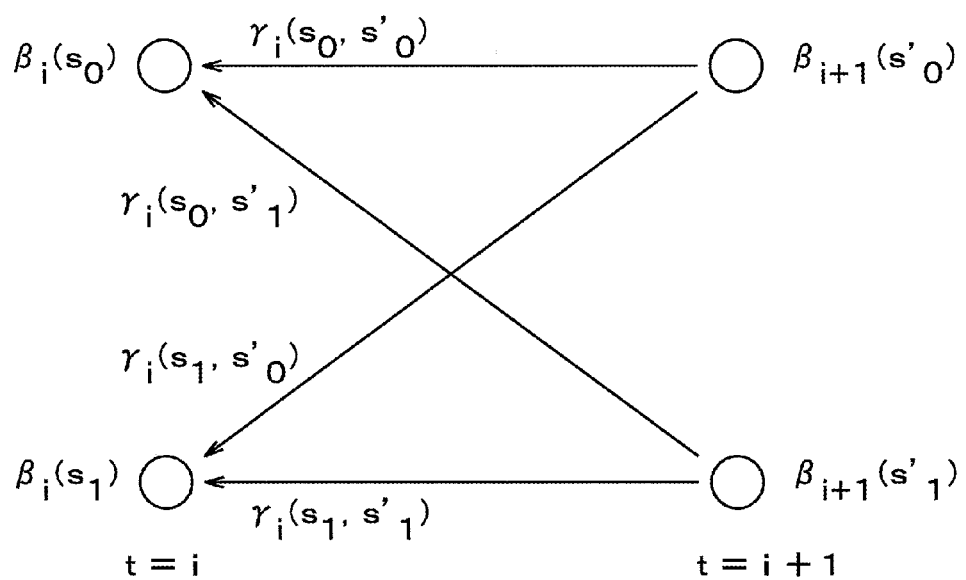
FIG. 5 is a diagram illustrating a relation between a posterior cumulative metric $\beta$ and a branch metric $\gamma$.

FIG. is a diagram illustrating the relations between posterior cumulative metrics β and branch metrics γ. In FIG. 5, each white circle represents a state. FIG. 5 illustrates the state $s_0$ and the state $s_1$ at the time t=i and the state $s'_0$ and the state $s'_1$ at the time t=i+1. The posterior cumulative metric β at the current time is calculated by using the posterior cumulative metric at the subsequent time and the branch metric at the current time.

Next, a posterior likelihood ($L_0, L_1$) is calculated for a case in which the bit value is 0 and a case in which the bit value is 1 at each time. And an optimal path is selected among possible trellis paths for the bit values at each time. The metric corresponding to the optimal path is the posterior likelihood. Further, the difference between the posterior likelihood for the case in which the bit value is 0 and the posterior likelihood for the case in which the bit value is 1 is calculated.

The difference L between the posterior likelihood at the time t=i is calculated as follows. It is noted that the max rule is employed for calculating the difference.

$$L_b(i) = \max_{(s_0, s_1) \in B_b}(\alpha_i(s_0) + \gamma_i(s_0, s_1) + \beta_{i+1}(s_1))$$

$$L(i) = (L_0(i) - L_1(i))/2$$

It is noted that L(i) is calculated in descending order from i=Kt−1 to i=0. The difference L(i) of the posterior likelihood is calculated along with the calculation of the posterior cumulative metric β. When the difference L(i) of the posterior likelihood is calculated, the stored anterior cumulative metrics α are used. In addition, b denotes a bit value 0 or 1. $L_b(i)$ represents the posterior likelihood of the maximum likelihood path with the bit value b at the time t=i. $B_b$ denotes a group of branches with the input bit value b. L(i) is used for $L_e(i)$ in the subsequent operation. The larger L(i) is, the more possible the value of the information bit for the branch at the time t=i is 0. In addition, L(i) can be used for other element decoders. $L_e(i)$ $(=L_e^{(next)}(i))$ used in the subsequent operation is represented using L(i) as follows.

$$L_e^{(next)}(i) = L(i) - y_s(i) - L_e(i)$$

(Modified Max-Log-MAP scheme)

A modified Max-Log-MAP scheme is described here. The Max-Log-MAP scheme uses the fact that one of the posterior likelihood ($L_0(i)$, $L_1(i)$) corresponding to two bit values at each time is the maximum likelihood path. That is, the path metric for the maximum likelihood path can be determined by the result of the α operations. The information bit corresponding to the branch included in the maximum likelihood path is an estimated bit. In the L operations (operations for calculating posterior likelihood), the posterior likelihood for the inverted bit of the estimated bit at each time is calculated.

When the state transits from the state s to the state s' at the time t=i, the branch metric γ is represented as follows.

$$g_i(u,p) = \bar{u} \cdot y_s(i) + \bar{p} \cdot y_p(i) + \bar{u} \cdot L_e(i) u, p \in \{0,1\}, u, p \in \{+1,-1\}$$

$$\gamma_i(s,s') = g_i(u,p)$$

It is noted that (u, p) denotes a local code corresponding to a branch B=(s, s').

The anterior cumulative metric α for the state s at the time t=i+1 is calculated as follows.

$$\alpha_{i+1}(s) = \max(\alpha_i(s_0) + \gamma_i(s_0,s), \alpha_i(s_1) + \gamma_i(s_1,s))$$

It is noted that the anterior cumulative metrics α are calculated in ascending order from i=0 to i=Kt−1. In addition, when the anterior cumulative metrics α are calculated, the information indicating which branch is selected is stored as flag (information). Each branch is distinguished by the corresponding input information bit. The flag information $q_i$ at the time t=i is represented by the following equation by using the input information bit u of the branch.

$$q_i(s) = u(s_x,s) x = 0 \text{ or } 1$$

It is noted that $s_x$ denotes the state of the selected branch at the time t=i.

In addition, the anterior cumulative metric $\alpha_{i,lose}$ for the branch which is not selected is also stored. $\alpha_{i,lose}$ is represented as follows.

$$\alpha_{i,lose}(s) = \alpha_i(s_y) y = 1 - x = 0 \text{ or } 1$$

It is noted that $s_y$ denotes the state of the branch which is not selected at the time t=i.

The maximum value of λ at the starting point $i_B$ of the traceback is defined as the path metric for the maximum likelihood path.

$$\lambda_i(s) = \alpha_i(s) + \beta_i(s)$$

$$L_{max} = \max_s(\lambda_{i_B}(s))$$

It is noted that when the trellis termination is performed, the state at the boundary is s=0. Thus, when the boundary condition for β is represented by $\beta_{i_B}(s)=0$, the following equation can be obtained.

$$L_{max} = \alpha_{i_B}(0)$$

When the flag information is used to trace the winning path from the termination state 0 at i=Kt−1, the maximum likelihood path can be determined. The flag information corresponding to the maximum likelihood path matches with the estimated bit (the hat of $u_t$).

$$\hat{u} = q_i(s)$$

When the posterior likelihood L is calculated, the anterior cumulative metrics α are calculated. Although the anterior cumulative metrics α are stored for the losing path, the anterior cumulative metrics α are not stored for the winning path. Therefore, the anterior cumulative metrics α are calculated by using the anterior cumulative metric at the preceding time and the branch metric at the current time. That is, the anterior cumulative metric α at the time t=i for the winning path is calculated by using the anterior cumulative metric at the time t=i+1 and the branch metric at the time t=i. In addition, the flag information is used to determine whether the anterior cumulative metric for a given state is the winning path or the losing path.

$$\alpha_i(s_y) = \alpha_{i,lose}(s)$$

The posterior cumulative metric β for the state s at the time t=i is calculated as follows.

$$\beta_i(s) = \max(\beta_{i+1}(s_0) + \gamma_i(s, s_0), \beta_{i+1}(s_1) + \gamma_i(s, s_1))$$

It is noted that the posterior cumulative metrics β are calculated in descending order from i=Kt−1 to i=0.

Next, the posterior likelihood ($L_0$, $L_1$) for the bit value 0 and the bit value 1 is calculated for each instant of time. The posterior likelihood for the bit value of the branch of the optimal path is represented by $L_{max}$. And the optimal metric path among trellis paths with the value of the inverted bit of the bit of the branch of the optimal path is selected as the posterior likelihood of the inverted bit. Additionally, the difference between the posterior likelihood of the bit value of the branch of the optimal path and the posterior likelihood of the inverted bit value of the bit of the branch of the optimal path is also calculated.

The difference L(i) between the posterior likelihood as described above at the time t=i is calculated as follows.

$$L_{\hat{u}_i}(i) = L_{max}$$

$$L_b = \max_{(s_0,s_1) \in B_b}(\alpha_i(s_0) + \gamma_i(s_0,s_1) + \beta_{i+1}(s_1))$$

$$L(i) = (L_1(i) - L_0(i))/2$$

It is noted that L(i) is calculated in descending order from i=Kt−1 to i=0. The difference L(i) between the posterior likelihood as described above is calculated along with the calculation of the posterior cumulative metric β. When the difference L(i) between the posterior accumulated is calculated, the stored anterior cumulative metrics α and the recalculated anterior cumulative metrics α are used.

Further, b denotes a bit value 0 or 1. $B_b$ denotes a group of branches with the input bit value b. L(i) is used for $L_e(i)$ in the subsequent operation. The larger L(i) is, the more possible the information bit of the branch at the time t=i is 0. In addition, L(i) can be used by other element decoders.

(SOVA Scheme)

SOVA (Soft Output Viterbi Algorithm) scheme is described below. The SOVA scheme is a scheme in which in the traceback of the maximum likelihood path the "losing path" against the maximum likelihood path at each instant of time is selected for the candidate for the "β operation" and the "L operation". In comparison with the Max-Log-MAP scheme, the amount of operations decreases but the operation quality can be lower. One of the features of the operations in the SOVA scheme is that the posterior cumulative metrics β are not used and the differences between the path metrics L are calculated. The posterior likelihood $L_{lose}$ for the losing path against the maximum likelihood path, which is the winning path, is calculated as follows by using the posterior likelihood $L_{win}$ of the maximum likelihood path and the difference Δ of the metrics in the α operations. It is noted that the min rule is employed for calculating the posterior likelihood.

$$L_{lose} = L_{win} + \Delta$$

The α operations are performed in a similar manner as the Max-Log-MAP scheme as described above. In addition, the difference Δ between the anterior cumulative metric for the branch which is selected in the α operation and the anterior cumulative metric for the branch which is not selected in the α operation is stored.

Further, the information of which branch is selected in the calculation of the anterior cumulative metric α is stored as a flag, namely a selection flag. Each branch is distinguished by the corresponding input information bit.

In the L operation calculating the difference L of the posterior likelihoods, the metric for the maximum likelihood path at the starting point of traceback is obtained as the result of the α operation. The value of the difference Δ of the metrics obtained as the result of the α operation and the selection flag are used to determine the "losing path" and calculate the metric value for the "losing path" by the relation as described above.

The difference L(i) of the posterior likelihood at the time t=i is obtained by the difference between the metric value of the maximum likelihood path and the metric value of the path with a higher likelihood among the losing paths which include the inverted bit of the estimated bit of the maximum likelihood path at the time t=i.

When two losing paths against the maximum likelihood are in one state when the traceback is performed, the path with more likelihood is selected. This process corresponds to β operation. L(i) is used for $L_e(i)$ in the subsequent operation.

In the SOVA scheme, the losing path which loses against the maximum likelihood path is selected as a candidate used for the L operation.

(Modified SOVA Scheme)

The modified SOVA scheme is described below. The modified SOVA scheme is known as a scheme for improving the performance of SOVA scheme.

In the SOVA scheme as described above, the losing path which includes a bit at the time t=i that is equal to the estimated bit at the time t=i for the maximum likelihood path is eliminated from the calculation of the posterior likelihood L(i). Therefore, in the above SOVA scheme, the number of candidates for the losing path may decrease when the difference L of the posterior likelihood L(i) is calculated. In order to improve the situation, when the branch of the losing path at the time t=i includes a bit which is equal to the estimated bit of the maximum likelihood path at the time t=i, the path which loses against the losing path at the time t=i is selected as a candidate.

With the modified SOVA scheme, the performance can be greatly improved comparing to the SOVA scheme. However, the performance of the modified SOVA scheme can be worse than the performance of the Max-Log-MAP scheme.

Embodiment 1

Configuration Example

Figure 6:
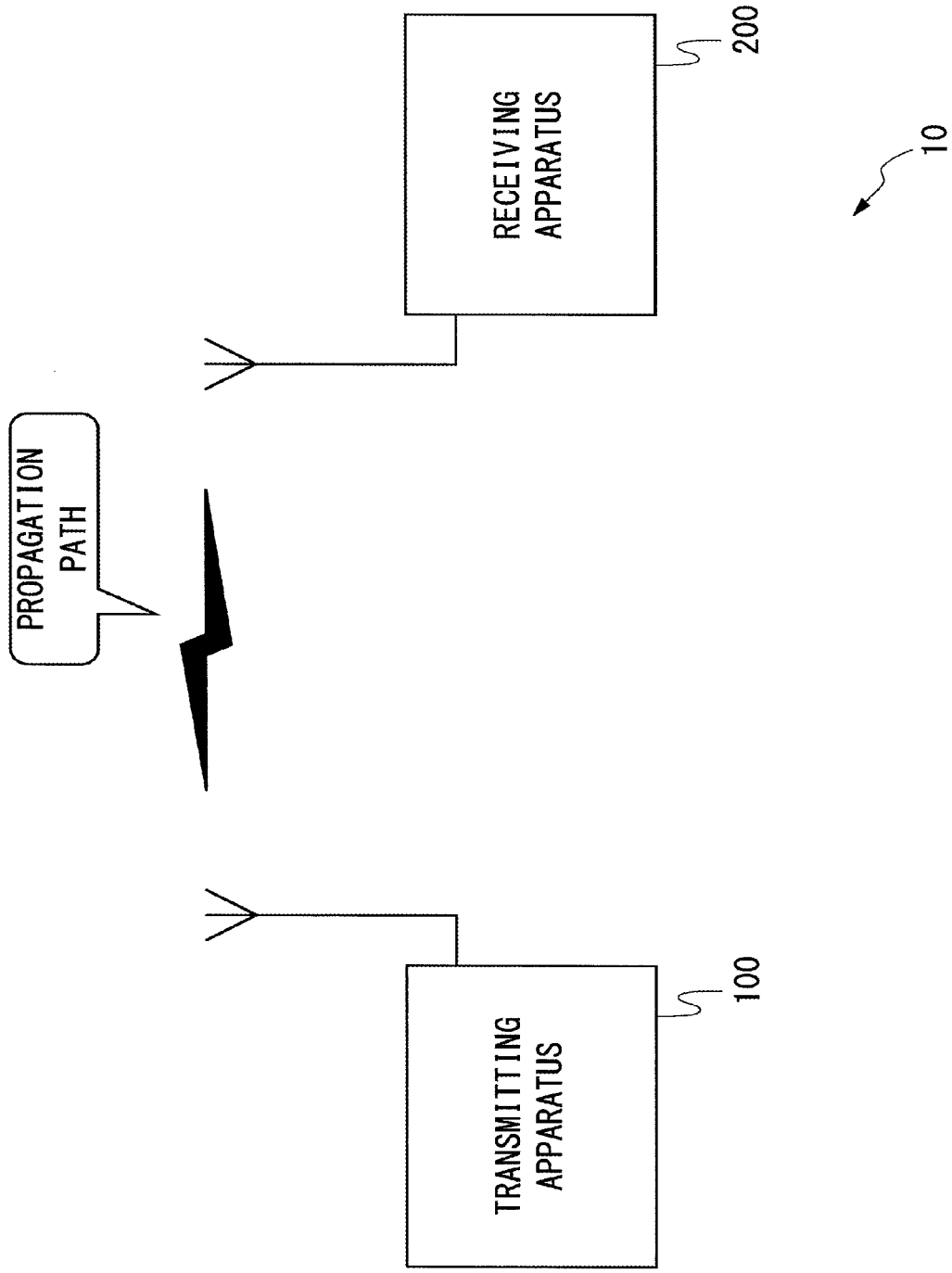
FIG. 6 is a diagram illustrating an example of a configuration of a communication system according to Embodiment 1.

FIG. 6 is a diagram illustrating a configuration example of a communication system according to the present embodiment. The communication system 10 is a system in which a transmitting apparatus 100 and a receiving apparatus 200 transmit and receive information bits via a propagation path (channel). As illustrated in FIG. 6, the communication system 10 according to the present embodiment includes the transmitting apparatus 100 and the receiving apparatus 200. The transmitting apparatus 100 transmits data to the receiving apparatus 200 via the propagation path (channel). The receiving apparatus 200 decodes the signals received from the transmitting apparatus 100. The receiving apparatus 200 corresponds to an example of a decoding apparatus.

Figure 7:
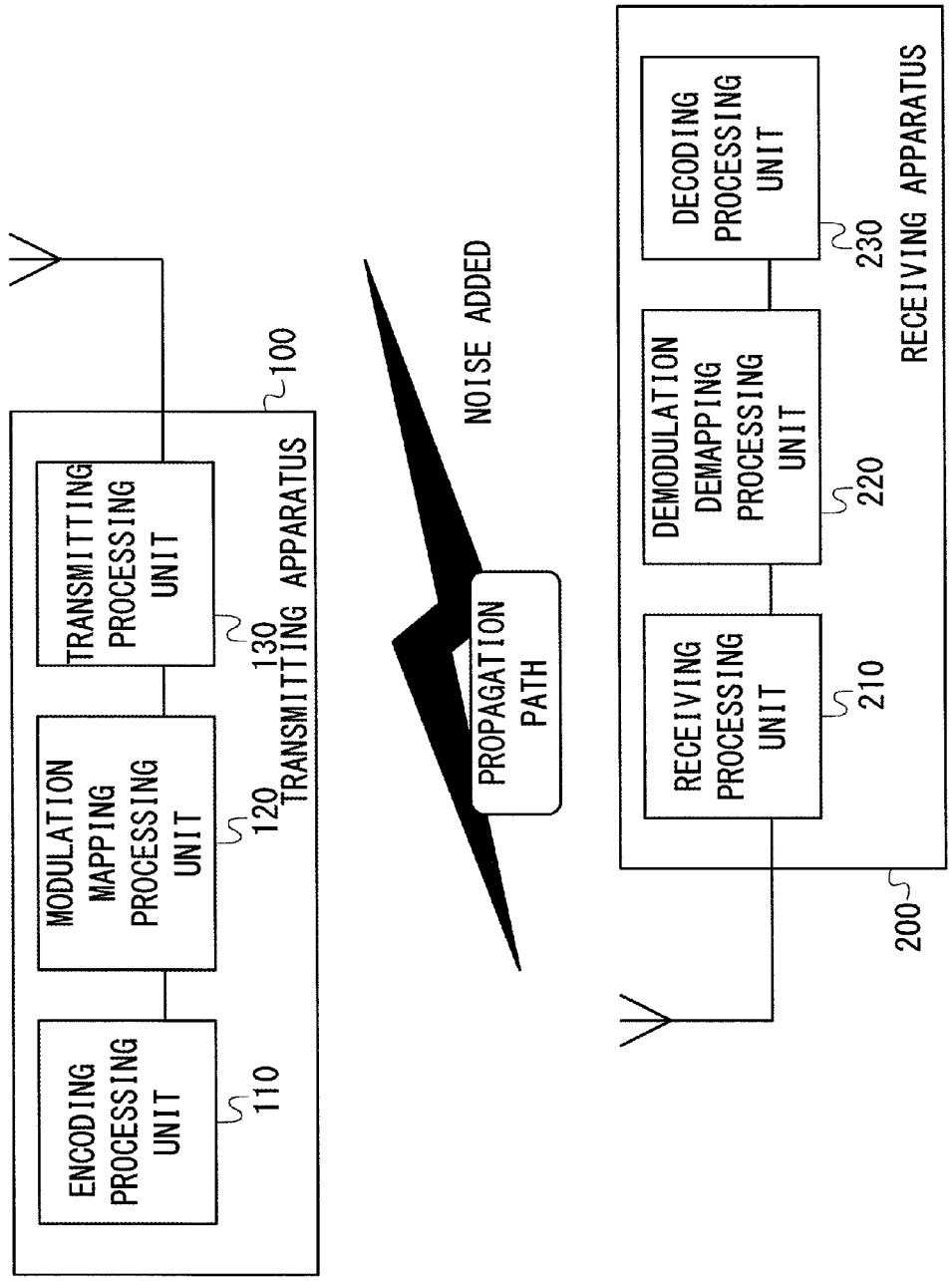
FIG. 7 is a diagram illustrating an example of a configuration of a transmitting apparatus and a receiving apparatus.

FIG. 7 is a diagram illustrating a configuration example of the transmitting apparatus and the receiving apparatus. The transmitting apparatus 100 in FIG. 7 includes an encoding processing unit 110, a modulation mapping processing unit 120 and a transmission processing unit 130.

The encoding processing unit 110 performs error correction encoding for information bit sequences and converts the sequences into sign bit sequences.

The modulation mapping processing unit 120 modulates the sign bits on a basis of the predetermined number of bits and maps the modulated bits to signal symbols. The signal symbols, which can be referred to merely as symbols, are represented by points on the complex plane, namely the signal space according to the original bit values.

The transmission processing unit 130 converts the signal symbols into transmission waves and transmits the transmission waves to the propagation path (channel).

Figure 8:
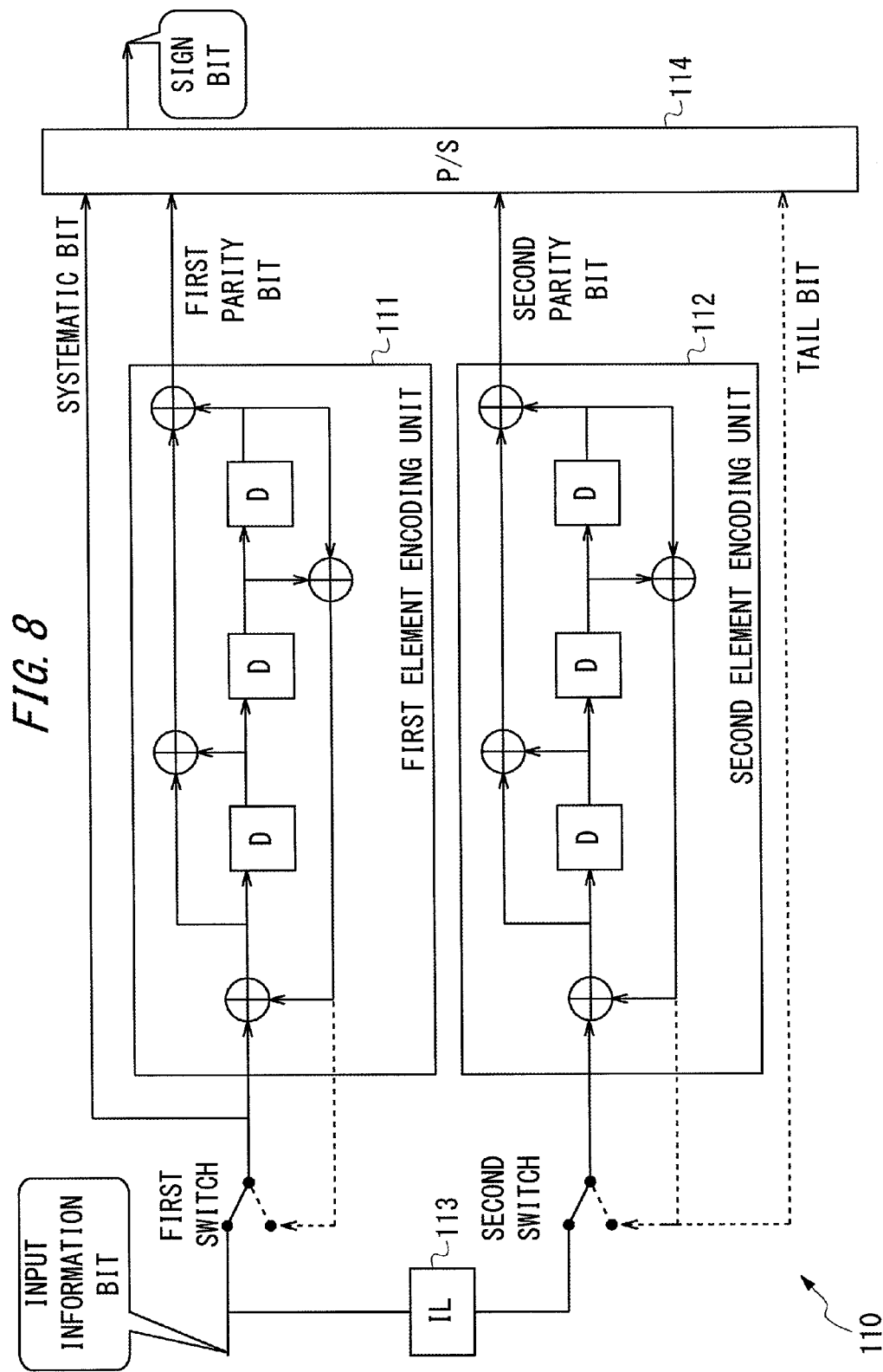
FIG. 8 is a diagram illustrating an example of an encoding processing unit.

FIG. 8 is a diagram illustrating an example of the encoding processing unit. The encoding processing unit 110 in FIG. 8 is, for example, an encoder in compliance with the wireless communication standard of 3GPP LTE etc. The encoding processing unit 110 includes a second element encoding unit 112 and an interleaver (IL) 113 for arranging the input bits from the information source. Additionally, the encoding processing unit 110 includes a parallel serial conversion unit 114.

The first element encoding unit 111 is a convolutional encoding unit including a shift register D and an exclusive OR circuit. The first element encoding unit 111 sequentially shifts the input data to generate the first parity bit and outputs the first parity bit. The second element encoding unit 112 generates and outputs the second parity bit in a similar manner.

When the input data is an information bit, which is 0 or 1, the first switch in the first element encoding unit 111 connects with the input side to capture the information bit into the first element encoding unit 111. Similarly, when the input data is an information bit, which is 0 or 1, the second switch in the second element encoding unit 112 connects with the input side which is interleaved by the interleaver (IL) 113 to capture the information bit into the second element encoding unit 112.

The parallel serial conversion unit 114 converts the systematic bit, the first parity bit, the second parity bit and the tail bit into a serial data and outputs the serial data as sign bit.

The receiving apparatus 200 in FIG. 7 includes a reception processing unit 210, a demodulation demapping processing unit 220 and a decoding processing unit 230.

The receiving processing unit 210 performs appropriate processes such as synchronous detection of the received data and determines the points corresponding to the received symbols in the signal space.

The demodulation demapping processing unit 220 calculates (reception) likelihood data corresponding to each bit of the received symbol. The likelihood data is also referred to as soft-decision data in terms of decoding processes. For example, the likelihood of a bit is a degree of certainty indicating that the bit is 0 or that the bit is 1.

The decoding processing unit 230 performs an error correction decoding process using the soft-decision data to estimate the transmission bit. The likelihood data from the demodulation demapping processing unit 220 is input into the decoding processing unit 230. The decoding processing unit 230 uses the likelihood data to calculate a decoding bit. A turbo decoder is an example of the decoding processing unit 230.

Figure 9:
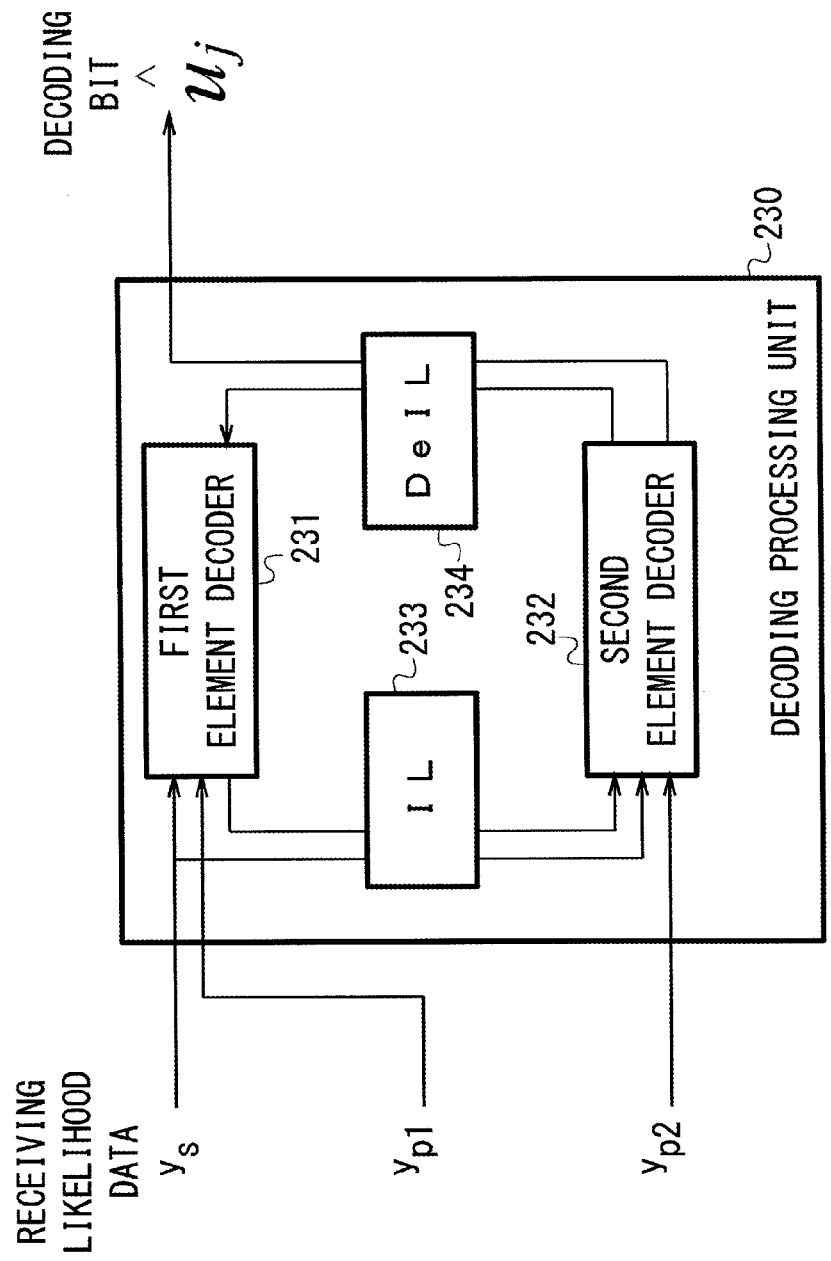
FIG. 9 is a diagram illustrating an example of a decoding processing unit.

FIG. 9 is a diagram illustrating an example of the decoding processing unit. The decoding processing unit 230 includes a first element decoder 231, a second element decoder 232, an interleaver (IL) 233 and a deinterleaver (DeIL) 234.

The first element decoder 231 uses likelihood data $y_s$, likelihood data $y_{p1}$ and data output from the second element decoder 232 etc. to calculate a decoding bit. The second element decoder 232 uses likelihood data $y_s$, likelihood data $y_{p2}$ and data output from the first element decoder 231 etc. to calculate a decoding bit. The interleaver 233 switches the sequence of the likelihood data $y_s$ and the data output from the first element decoder 231 and outputs the switched data to the second element decoder 232. The deinterleaver 234 switches the sequence of the data output from the second element decoder 232 and outputs the switched data to the first element decoder 231. In addition, the deinterleaver 234 switches the sequence of the data output from the second element decoder 232 and output the switched data as decoding bit.

The posterior likelihood output from the first element decoder 231 is interleaved as an input data for the second element decoder 232. The posterior likelihood output from the first element decoder 231 is interpreted as the anterior likelihood in the subsequent operation in the first element decoder 231. When the first element decoder 231 and the second element decoder 232 repeatedly performs the operations as described above, the signal-noise ratio of the output data can be improved.

The transmitting apparatus 100 and the receiving apparatus 200 can be implemented by use of dedicated or general computers or electronic devised equipped with computers.

The computer, namely information processing apparatus includes a processor, main memory, secondary memory and interface devices for peripheral devices such as communication interface devices. The memory including the main memory and the secondary memory is a computer readable storage medium.

The computer performs functions in accordance with predetermined purposes by a processor which loads programs stored in the storage medium onto a work area of the main memory to execute the programs and controls peripheral devices by the execution of the programs.

The processor is, for example, a CPU (Central Processing Unit) or a DSP (Data Signal Processor). The main memory is, for example, a RAM (Random Access Memory) or a ROM (Read Only Memory).

The secondary memory is, for example, an EPROM (Erasable Programmable ROM) or a HDD (Hard Disk Drive). In addition, the secondary memory includes a removable medium, namely portable storage medium. The removable medium is, for example, a USB (Universal Serial Bus) memory or a disk recording medium such as a CD (Compact Disc) and a DVD (Digital Versatile Disc).

The communication interface device is, for example, a LAN (Local Area Network) interface board or a wireless communication circuit.

The peripheral device includes the secondary memory and the communication interface device as described above. In addition, the peripheral device also includes an input device such as a keyboard and a pointing device and an output device such as a display and a printer. Further, the input device also includes an input device for video or picture such as a camera and an input device for sound such as a microphone. Moreover, the output device includes an output device for sound such as a speaker.

The main memory or the secondary memory stores the OS (Operating System), a variety of programs and tables etc. The OS is software for mediating between software and hardware, administrating the memory space, administrating files and administrating processes and tasks.

A series of processes can be performed by either the hardware or the software. The transmitting apparatus 100 and the receiving apparatus 200 can be achieved by employing a hardware element or a software element or by combining the hardware element and the software element.

The hardware element is a hardware circuit such as an FPGA (Field Programmable Gate Array), an ASIC (Application Specific Integrated Circuit), a gate array, a combination of logical gates and an analog circuit.

The software element is a part for performing predetermined processes as software. The software element is not limited to a specific language for the software and a specific development environment.

The steps for describing programs include not only processes in which the steps are sequentially performed according to the description order but also processes in which the steps are performed in parallel or individually.

Figure 10:
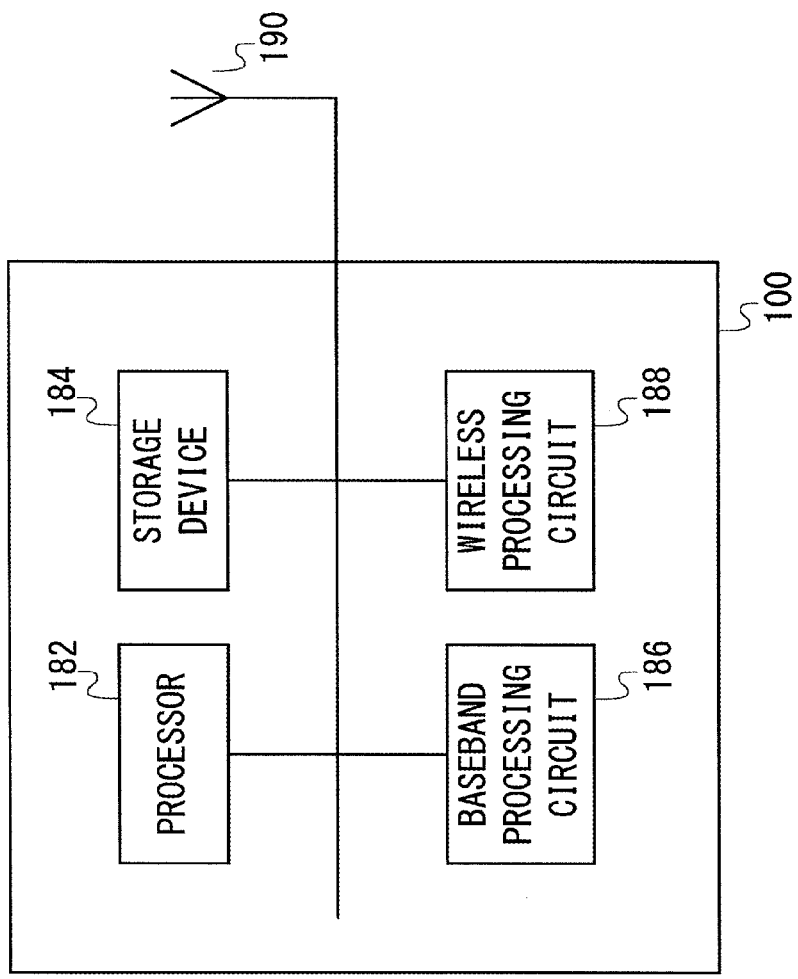
FIG. 10 is a diagram illustrating an example of a hardware configuration of a transmitting apparatus.

FIG. 10 is a diagram illustrating an example of hardware configurations of the transmitting apparatus. The transmitting apparatus 100 includes a processor 182, memory 184, a baseband processing circuit 186, a wireless processing circuit 188 and an antenna 190. The processor 182, the memory 184, the baseband processing circuit 186, the wireless processing circuit 188 and the antenna 190 are connected with one another via a bus.

The processor 182 can function as the encoding processing unit 110, the modulation mapping processing unit 120 and the transmission processing unit 130. The processor 182 is an example of an operating unit. The memory 184 stores programs executed by the processor and data used when the programs are executed. The memory 184 is an example of a storage unit. The baseband processing unit 186 processes baseband signals. The wireless processing circuit 188 processes wireless signals transmitted from and received by the antenna 190. The antenna 190 transmits transmission signals which have been processed by the wireless processing circuit 188 etc.

Figure 11:
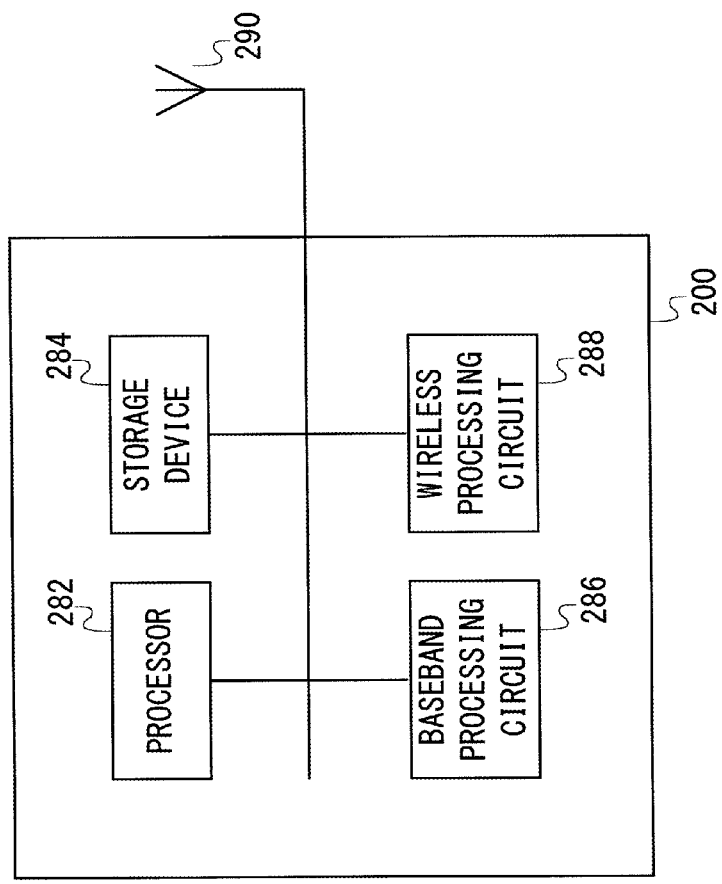
FIG. 11 is a diagram illustrating an example of a hardware configuration of a receiving apparatus.

FIG. 11 is a diagram illustrating an example of a hardware configuration of the receiving apparatus. The receiving apparatus 200 includes a processor 282, memory 284, a baseband processing circuit 286, a wireless processing circuit 288 and an antenna 290. The processor 282, the memory 284, the baseband processing circuit 286, the wireless processing circuit 288 and the antenna 290 are connected with one another via a bus.

The processor 282 can function as the receiving processing unit 210, the demodulation demapping processing unit 220 and the decoding processing unit 230. The processor 282 is an example of an operating unit. The memory 284 stores programs executed by the processor and data used when the programs are executed. The memory 284 is an example of a storage unit. The memory can be a plurality of memory units. The baseband processing unit 286 processes baseband signals. The wireless processing circuit 288 processes wireless signals transmitted from and received by the antenna 290. The antenna 290 receives signals transmitted from other apparatus.

The processes for the decoding processing unit 230 etc. are performed by the programs executed by the processor, for example. The processes for the decoding unit 230 can be performed by a circuit such as an ASIC and an FPGA.

Operation Example 1

Operation Example 1 of the decoding processing unit 230 and the first element decoder 231 is describedbelow. Likelihood data $y_s$ and $y_{p1}$ (referred to as $y_p$ in some cases) are output from the demodulation demapping processing unit and input into the first element decoder 231. The first element decoder 231 outputs decoding bits. The operations of the second element decoder 232 are similar to the operations of the first element decoder 231.

In Operation Example 1, the first element decoder 231 performs the likelihood operations using the SOVA scheme in a similar manner of the Max-Log-MAP scheme.

Figure 12:
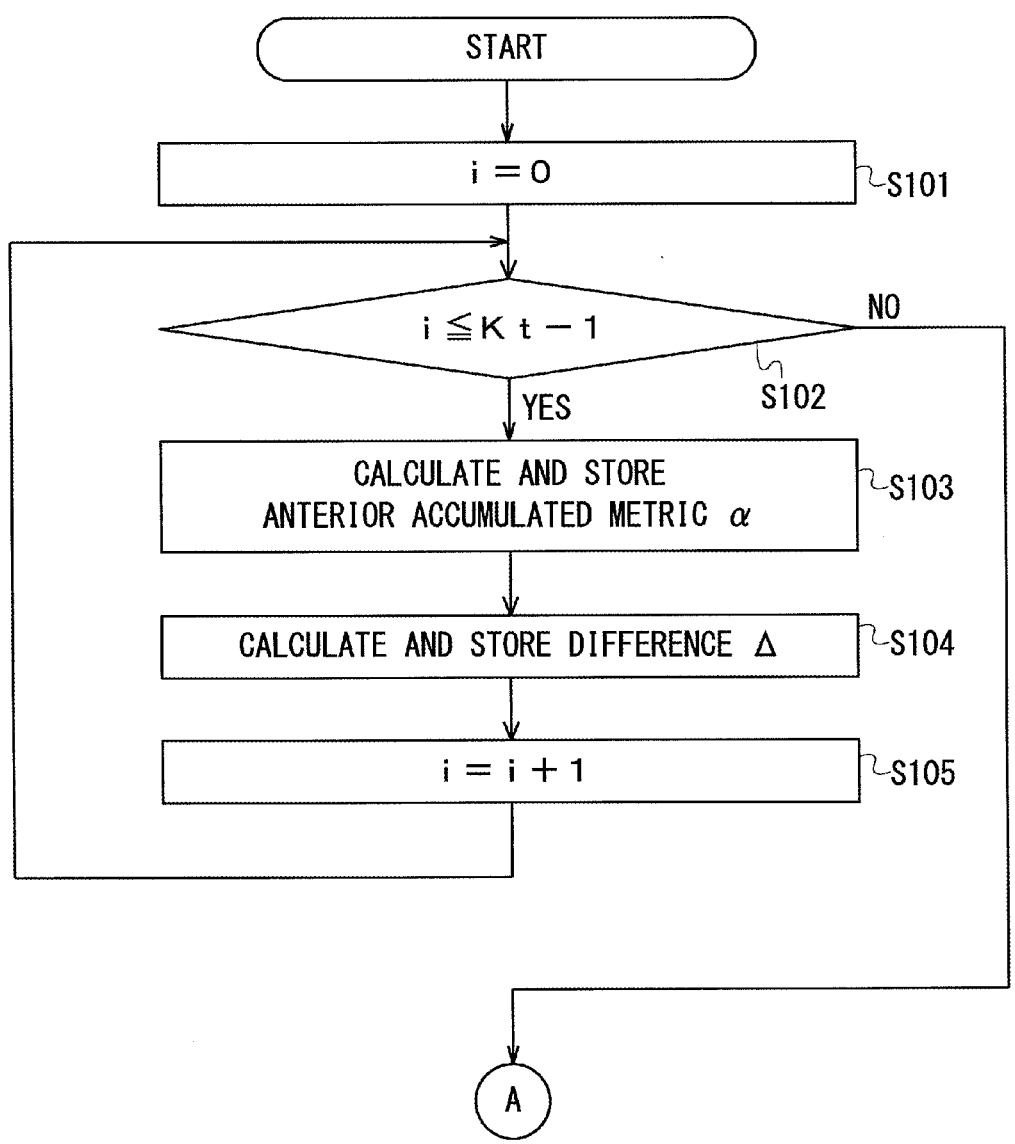
FIG. 12 is a diagram illustrating Example (1) of an operation flow of likelihood operations performed by the first element decoder 231 in Operation Example 1.
Figure 13:
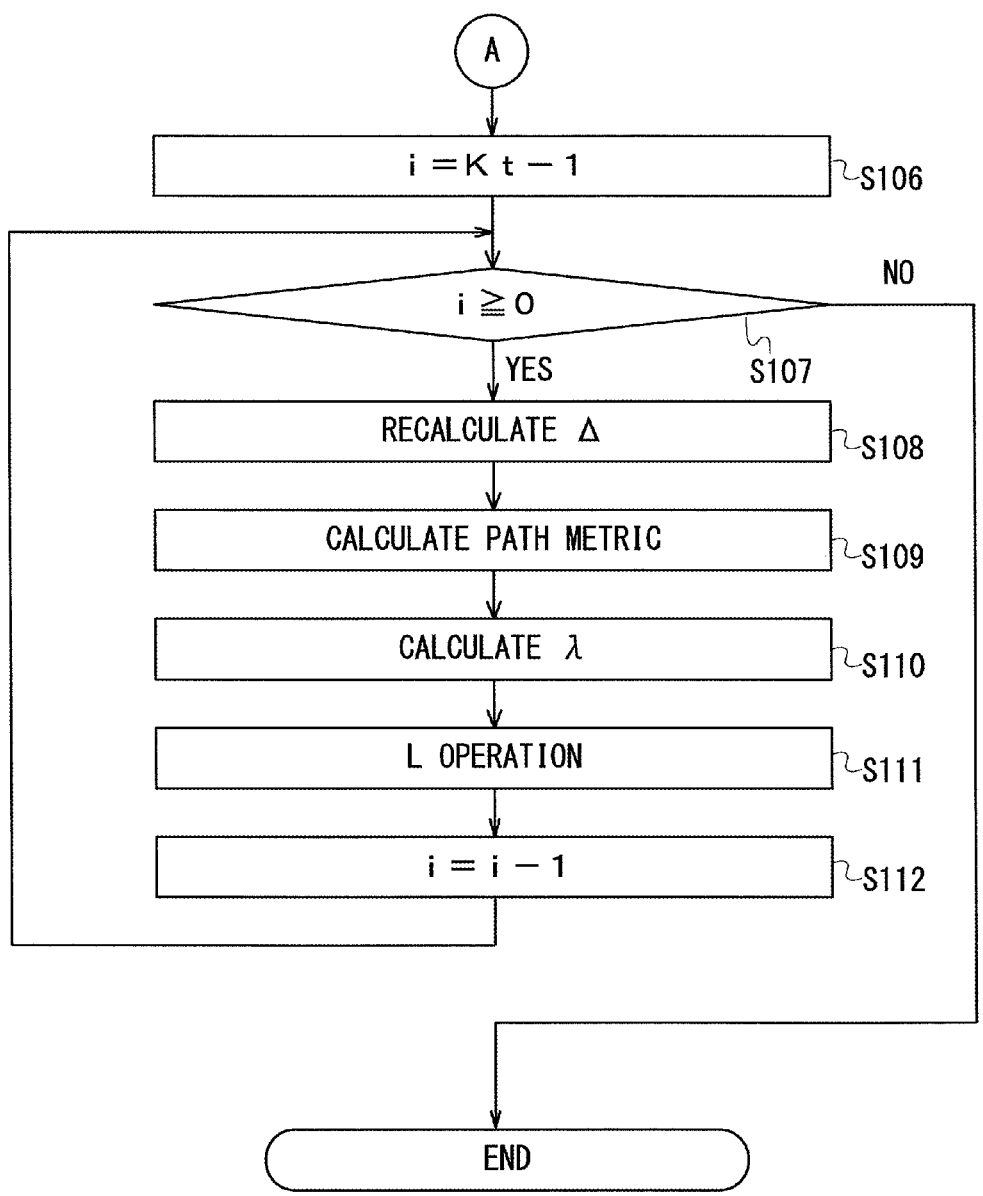
FIG. 13 is a diagram illustrating Example (2) of an operation flow of likelihood operations performed by the first element decoder 231 in Operation Example 1.

FIGS. 12 and 13 are diagrams illustrating operation flows of the likelihood operations performed by the first element decoder 231 in Operation Example 1. "A" in FIG. 12 is connected with "A" in FIG. 13.

The processes from step S101 to step S105 are processes in the anterior cumulative metric operation ($\alpha$ operation).

In step S101, the first element decoder 231 uses a variable i and assigns an initial value 0 to the variable i. The variable i is a variable corresponding to time. The time t=0 means the starting time.

In step S102, the first element decoder 231 determines whether or not the variable i is equal to or smaller than Kt−1. The predetermined value Kt corresponds to the length of one information bit sequence input into the first element decoder 231. When the variable i is equal to or smaller than Kt−1 (S102: Yes), the process proceeds to step S103. When the variable i is neither equal to nor smaller than Kt−1 (S102: No), the process proceeds to step S106. The time t=Kt means the end time.

In step S103, the first element decoder 231 calculates and stores the anterior cumulative metric at the time t=ti+1.

The first element decoder 231 acquires the likelihood data $y_s(i)$, the likelihood data $y_p(i)$ and the posterior likelihood data $L_e(i)$ at the time t=i. The first element decoder 231 acquires the likelihood data $y_s$, the likelihood data $y_p$ and the posterior likelihood data $L_e$ at the time t=i stored in the memory, for example. The first element decoder 231 calculates the branch metric $\gamma$ for each branch from the time t=i to t=i+1. When the state s at the time t=i transits to the state s' at the time t=i+1, the branch metric $\gamma$ is represented as follows.

$$g_i(u,p) = -\hat{u} \cdot y_s(i) - \hat{p} \cdot y_p(i) - \hat{u} \cdot L_e(i) u, p \in \{0,1\}$$

$$\gamma_i(s,s') = g_i(u,p)$$

(u, p) denotes a local code corresponding to the branch B (s, s'). $L_e$ denotes the posterior likelihood in the preceding operation. $L_e$ can be the posterior likelihood in an operation performed by another element decoder such as the second element decoder 232. In the initial operation, $L_e$ is 0, for example.

In addition, the first element decoder 231 performs the anterior cumulative metric operation ($\alpha$ operation). The anterior cumulative metric $\alpha$ for the state s at the time t=i+1 can be calculated as described below. It is assumed here that the state $s_0$ and the state $s_1$ transits to the state s on the trellis diagram. Additionally, it is assumed that $\alpha_0(s)=0$.

$$\alpha_{i+1}(s) = \min(\alpha_i(s_0) + \gamma_i(s_0,s), \alpha_i(s_1) + \gamma_i(s_1,s))$$

The first element decoder 231 calculates $\alpha_{i+1}(s)$ for each state s at the time t=i+1 and stores $\alpha_{i+1}(s)$ in the memory.

In step S104, the first element decoder 231 calculates the difference $\Delta$ between the likelihood for the winning path and the likelihood for the losing path.

Figure 14:
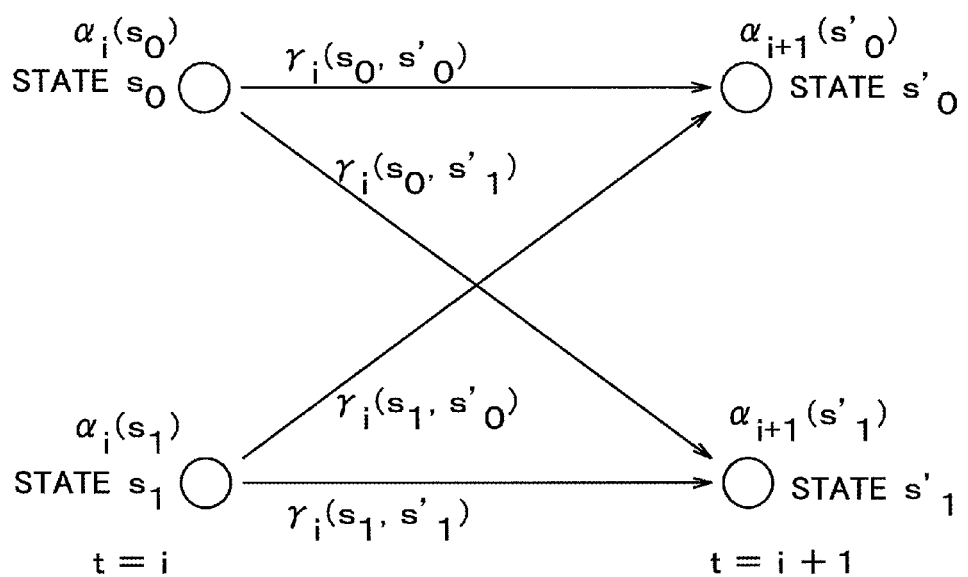
FIG. 14 is a diagram illustrating an example of an anterior cumulative metric $\alpha$ and a branch metric $\gamma$.

FIG. 14 is a diagram illustrating an example of the anterior cumulative metric $\alpha$ and the branch metric $\gamma$. FIG. 14 illustrates two starting states $s_0$ and $s_1$ and two end states $s'_0$ and $s'_1$. As illustrated in FIG. 14, the diagram in which two starting states are connected with two end states via branches is referred to as butterfly. In the trellis diagram, four butterflies are found between the time t=i and the time t=i+1. In FIG. 2, an example of butterfly is indicated by the part enclosed with the dotted line. Similarly, in FIG. 3, examples of butterfly are indicated by the parts enclosed with the dotted lines.

The first element decoder 231 performs the operations represented by the following equation for the four butterflies between the time t=i and the time t=i+1. It is assumed here that the states $s_0$ and $s_1$ at the time t=i transit to the states $s'_0$ and $s'_1$ at the time t=i+1 in one butterfly.

$$\delta_i(s_0,s_1) = \alpha_i(s_0) - \alpha_i(s_1)$$

The following relational equations can be obtained for each butterfly according to the symmetry of the local code.

$$\gamma_i(s_0,s'_0) = \gamma_i(s_1,s'_1) = \gamma_{i,0}$$

$$\gamma_i(s_0,s'_0) = \gamma_i(s_1,s'_1) = \gamma_{i,0}$$

$\gamma_{i,o}$ can be stored in the memory. It is assumed here that the branch B=$(s_0, s'_0)$ and the branch B=$(s_1, s'_1)$ correspond to the information bit u=0 and the branch B=$(s_0, s'_1)$ and the branch $(s_1, s'_0)$ correspond to the information bit u=1. Here, the difference $\Delta$ of the likelihoods of the two paths used for the calculation of the anterior cumulative metric $\alpha_{i+1}(s)$ for the state s at the time t=i+1 is defined as follows.

$$\begin{aligned}
\Delta_i(s'_0) &= (\alpha_i(s_0) + \gamma_i(s_0, s'_0)) - (\alpha_i(s_1) + \gamma_i(s_1, s'_0)) \\
&= (\alpha_i(s_0) - \alpha_i(s_1)) + (\gamma_i(s_0, s'_0) - \gamma_i(s_1, s'_0)) \\
&= \delta_i(s_0, s_1) + (\gamma_{i,0} - (-\gamma_{i,0})) \\
&= \delta_i(s_0, s_1) + 2\gamma_{i,0} \\
\Delta_i(s'_1) &= (\alpha_i(s_1) + \gamma_i(s_1, s'_1)) - (\alpha_i(s_0) + \gamma_i(s_0, s'_1)) \\
&= -(\alpha_i(s_0) - \alpha_i(s_1)) + (\gamma_i(s_1, s'_1) - \gamma_i(s_0, s'_1)) \\
&= -\delta_i(s_0, s_1) + (\gamma_{i,0} - (-\gamma_{i,0})) \\
&= -\delta_i(s_0, s_1) + 2\gamma_{i,0}
\end{aligned}$$

The first element decoder 231 calculates the difference $\Delta_i(s)$ of the likelihoods for each state s at the time t=i+1.

The difference $\Delta_i$ becomes negative when a path for which the information bit u is 0 at the time t=i is a path with a higher likelihood. And the difference $\Delta_i$ becomes positive when a path for which the information bit u is 1 at the time t=i is a path with a higher likelihood. The anterior cumulative metric $\alpha$ can be represented by the positive and negative of the difference $\Delta$ and $\gamma_{i,o}$ as described above as follows.

$$\alpha_{i+1}(s'_0) = \begin{cases} \alpha_i(s_0) + \gamma_{i,0} & \Delta_i(s'_0) \leq 0 \\ \alpha_i(s_1) - \gamma_{i,0} & \Delta_i(s'_0) > 0 \end{cases}$$

$$\alpha_{i+1}(s'_1) = \begin{cases} \alpha_i(s_1) + \gamma_{i,0} & \Delta_i(s'_1) \leq 0 \\ \alpha_i(s_0) - \gamma_{i,0} & \Delta_i(s'_1) > 0 \end{cases}$$

The first element decoder 231 stores the one $\Delta_i(s'_0)$ of the two differences $\Delta_i(s'_0)$ and $\Delta_i(s'_1)$ for one butterfly between the time t=i and the time t=i+1. That is, four differences $\Delta_i$ are stored in the memory for the four butterflies between the time t=i and the time t=i+1. It is noted that the difference $\Delta_i(s'_1)$ can be calculated by the difference $\Delta_i(s'_0)$ and $\gamma_{i,o}$ without complicated calculations. Therefore, the difference $\Delta_i(s'_1)$ is not stored in the memory in some cases.

In addition, the first element decoder 231 stores $\alpha_{i+1}(s'_0)$ and $\alpha_{i+1}(s'_1)$ in the memory. $\alpha_{i+1}(s'_0)$ and $\alpha_{i+1}(s'_1)$ stored in the memory are used when a is calculated at the subsequent time t=i+2. The first element decoder 231 can delete $\alpha_{i+1}(s'_0)$ and $\alpha_{i+1}(s'_1)$ from the memory. When $\alpha_{i+1}(s'_0)$ and $\alpha_{i+1}(s'_1)$ are deleted from the memory, the amount of the memory usage can be decreased.

In step S105, the first element decoder 231 assigns i+t to the variable i and returns the process to step S102. When the variable i is larger than Kt−1, the process proceeds via step S102 to step S106.

Processes for the posterior likelihood operation (L operation) are performed in the steps from step S106. When the winning path is traced from the end state s=0 for i=Kt−1 by use of the flag information, namely the path selection flag information, the maximum likelihood path can be determined. The flag information corresponding to the maximum likelihood path matches with the estimated bit (the hat of $u_i$).

$$\hat{u} = q_i(s)$$

In step S106, the first element decoder 231 uses the variable i and assigns Kt−1 to the variable i. The time t=Kt means the starting point of traceback.

In step S107, the first element decoder 231 determines whether or not the variable i is equal to or larger than 0. When the variable i is equal to or larger than 0 (S107: Yes), the process proceeds to step S108. When the variable i is neither equal to nor larger than 0 (S107: No), the process is finished. In step S108, the first element decoder 231 calculates the difference $\Delta_i$ of the likelihoods at the time t=i.

The first element decoder 231 acquires the likelihood data $y_s$, the likelihood data $y_p(i)$ and the posterior likelihood data $L_e(i)$ at the time t=i. The first element decoder 231 acquires the likelihood data $y_s$, the likelihood data $y_p$ and the posterior likelihood data $L_e$ at the time t=i stored in the memory, for example. The first element decoder 231 calculates $\gamma_{i,o}$ based on the likelihood data $y_s$, the likelihood data $y_p$ and the posterior likelihood data $L_e$ at the time t=i. When $\gamma_{i,o}$ is stored in the memory, the first element decoder 231 can acquire $\gamma_{i,o}$ from the memory.

The first element decoder 231 acquires the difference $\Delta_i(s'_0)$ stored in the memory. In addition, the first element decoder 231 calculates the difference $\Delta_i(s'_1)$, which is not stored in the memory. The difference $\Delta_i(s'_1)$, which is not stored in the memory, can be calculated by use of the difference $\Delta_i(s'_0)$ and $\gamma_{i,o}$ as follows.

$$\Delta_i(s'_1) = -\Delta_i(s'_0) + 4\gamma_{i,0}$$

Further, the path selection flag $q_i$ for the path which transits to the state $s'_k$ at the time t=i+1 can be represented as follows.

$$q_i(s'_k) = 1 - \text{sign}(\Delta_i(s'_k))/2$$

Thus, the positive and negative of the difference $\Delta_i$ corresponds to the value of the path selection flag $q_i$. Consequently, the positive and negative of the difference $\Delta_i$ corresponds to the value of the estimated bit.

In step S109, the first element decoder 231 calculates for each branch the path metric $L_i$ of the maximum likelihood path among the paths going through the branches between the time t=i and the time t=i+1.

It is assumed here that the metric for the maximum likelihood path among the paths going through the state s at the time t=i is represented as $\lambda_i(s) = \alpha_i(s) + \beta_i(s)$. The first element decoder 231 calculates the minimum value of $\lambda_{iB}$ at the starting point $i_B$ of the traceback and determines the minimum value as $L_{min}$.

$$L_{min} = \min_s(\lambda_{iB}(s))$$

It is noted that since trellis termination is used in the above equation, the state s at the boundary is 0. Therefore, when the boundary condition of $\beta$ is $\beta_{iB}(s) = 0$, the following equation can be obtained.

$$L_{min} = \lambda_{iB}(0) = \alpha_{iB}(0)$$

It is noted that the starting point of the traceback is the time t=Kt. $L_{min}$ is the path metric for the maximum likelihood path.

The first element decoder 231 uses $\lambda_{i+1}(s')$ and the path selection information to calculate the metric for the maximum likelihood path among the paths including branches which transit from the state s at the time t=i to the state s' at the time t=i+1. The path selection information for the branch transiting to the state s' at the time t=i can be obtained from the positive and negative of $\Delta_i(s')$. It is assumed that the metric for the maximum likelihood path among the paths including branches which transit from the state s at the time t=i to the state s' at the time t=i+1.

When $q_i(s'_0) = 0$, the following formula is obtained.

$$(\alpha_i(s_0) + \gamma_i(s_0, s'_0)) > (\alpha_i(s_1) + \gamma_i(s_1, s'_0))$$

The path which goes through the branch $(s_1, s'_0)$ at the time t=i is more preferable than the path which goes through the branch $(s_0, s'_0)$. Therefore, the following formulas are obtained.

$$L_i(s_0, s'_0) = \lambda_{i+1}(s'_0) + |\Delta_i(s'_0)|, L_i(s_1, s'_0) = \lambda_{i+1}(s'_0)$$

Similarly, when $q_i(s'_1) = 0$, the following formula is obtained.

$$(\alpha_i(s_1) + \gamma_i(s_1, s'_1)) > (\alpha_i(s_0) + \gamma_i(s_0, s'_1))$$

Thus, the path which goes through the branch $(s_0, s'_1)$ at the time t=i is more preferable than the path which goes through the branch $(s_1, s'_1)$. Therefore, the following formulas are obtained.

$$L_i(s_0, s'_1) = \lambda_{i+1}(s'_1), L_i(s_1, s'_1) = \lambda_{i+1}(s'_1) + |\Delta_i(s'_1)|$$

The path metric $L_i$ is calculated based on $\lambda_{i+1}$ and $\Delta_i$.

In generalization, when $q_i(s'_k)=0$, the following formulas are obtained.

$$L_i(s_k,s'_k)=\lambda_{i+1}(s'_k)+|\Delta_i(s'_k)|, L_i(s_{1-k},s'_k)=\lambda_{i+1}(s'_k)$$

Further, when $q_i(s'_k)=1$, the following formula is obtained.

$$L_i(s_k,s'_k)=\lambda_{i+1}(s'_k), L_i(s_{1-k},s'_k)=\lambda_{i+1}(s'_k)+|\Delta_i(s'_k)|$$

In this way, the first element decoder 231 calculates for each branch the path metric $L_i$ of the maximum likelihood path among the paths which go through the branch between the time t=i and the time t=i+1. The calculated math metric $L_i$ is stored in the memory. When $\lambda_{i+1}(s'_k)$ does not exist, the path metric $L_i(s, s'_k)$ is not calculated. That is, the path metric for the maximum likelihood path for which the path metric is $L_{min}$ and the path metric $L_i$ of the path which loses against the maximum likelihood path after the time t=i are calculated.

For example, when i=Kt−1, $\lambda_{i+1}(s'_k)$ for which the state $s'_k$ is other than 0 does not exist. Therefore, when i=Kt−1 and the state $s'_k$ is other than 0, the path metric $L_i$ is not calculated.

In step S110, the first element decoder 231 uses the path metric Li to calculate $\lambda_i(s)$.

The first element decoder 231 uses $L_i$ to calculate $\lambda_i(s)$ for each state as described below. The calculated $\lambda_i(s)$ is stored in the memory. Thus, in a case in which the surviving paths are input into one state when the traceback is performed, the maximum likelihood path is selected from the surviving paths. The calculations correspond to the β operation.

$$\lambda_i(s_k)=\min(L_i(s_k,s'_0),L_i(s_k,s'_1))$$

It is noted that when neither $L_i(s_k, s'_0)$ nor $L_i(s_k, s'_1)$ exists, $\lambda_i(s_k)$ is not calculated. In this case, $\lambda_i(s_k)$ does not exist in the memory.

In step S111, the first element decoder 231 uses the path metric $L_i$ to calculate the posterior likelihood L(i).

The first element decoder 231 uses $L_i$ to calculate the posterior likelihood L(i) at the time t=i as described below. The calculated posterior likelihood L(i) is stored in the memory.

$$L_{\hat{u}_i}(i)=L_{min}$$

$$L_b(i) = \min_{(s_1,s_2)\in B_b} (L_i(s_1, s_2)), b = 1 - \hat{u}_i$$

$$L(i) = \frac{(L_1(i) - L_0(i))}{2}$$

b denotes a bit value 0 or 1. b is a rival bit value of the input bit value of the maximum likelihood path at the time t=i. $B_b$ is a group of branches with the input bit value b. The smaller L(i) is, the higher the probability that the value of the information bit of the branches at the time t=i is 1 is. $L_i(s_1, s_2)$ in the second formula of the above formulas at least includes the paths which lose against the maximum likelihood path at the time t=i+1.

In step S112, the first element decoder 231 assigns i−1 to the variable i and return the process to step S107. When the variable i is smaller than 0 (S107: No), the process is finished.

The first element decoder 231 determines the maximum likelihood path by tracing the winning paths from the end state 0 at i=Kt−1 based on the flag information, namely path selection information. The first element decoder 231 calculates the posterior likelihood L(i) in descending order from i=Kt−1 to i=0. L(i) is used for $L_e(i)$ in the subsequent operation. L(i) can be used by other element decoders.

In Operation Example 1, the first element decoder 231 uses SOVA operation scheme to calculate the likelihood in a similar manner of the Max-Log-MAP scheme. However, the a operation is an operation performed on a butterfly basis. In SOVA, the difference Δ of likelihood is used in the operations to update the likelihood for each bit. When the symmetry of the local code on a branch included in a butterfly is used, the operation can be simplified. Therefore, with the method in Operation Example 1, the performance corresponding to the Max-Log-MAP scheme can be achieved.

In the SOVA scheme, Δ is defined as the difference between the cumulative metric α of the information bit u=0 and the cumulative metric α of the information bit u=1. Thus, Δ is the increase when tracing from the winning path to the losing path. It can be understood that Δ corresponds to the difference of the likelihoods in magnitude and the sign bit indicating the positive or negative is a flag corresponding to the winning or losing between u=0 and u=1. Δ is used to calculate Δ for the other side. Thus, the amount of calculation can be reduced.

Operation Example 2

Next, Operation Example 2 is described below. Operation Example 2 includes features in common with Operation Example 1. Therefore, the differences are mainly described and the detailed descriptions of the common features are omitted.

The operations performed by the first element decoder 231 of the decoding processing unit 230 are described here. The likelihood data $y_s$ and the likelihood data $y_{p1}$, namely $y_p$ are into the element decoder 231 from the demodulation demapping processing unit. The first element decoder 231 outputs decoding bits. The functions of the second element decoder 232 are similar to the functions of the first element decoder 231.

In Operation Example 2, the first element decoder 231 uses the modified SOVA scheme to perform the likelihood operations in a similar manner of the Max-Log-MAP scheme. It is noted that the min rule is used.

Figure 16:
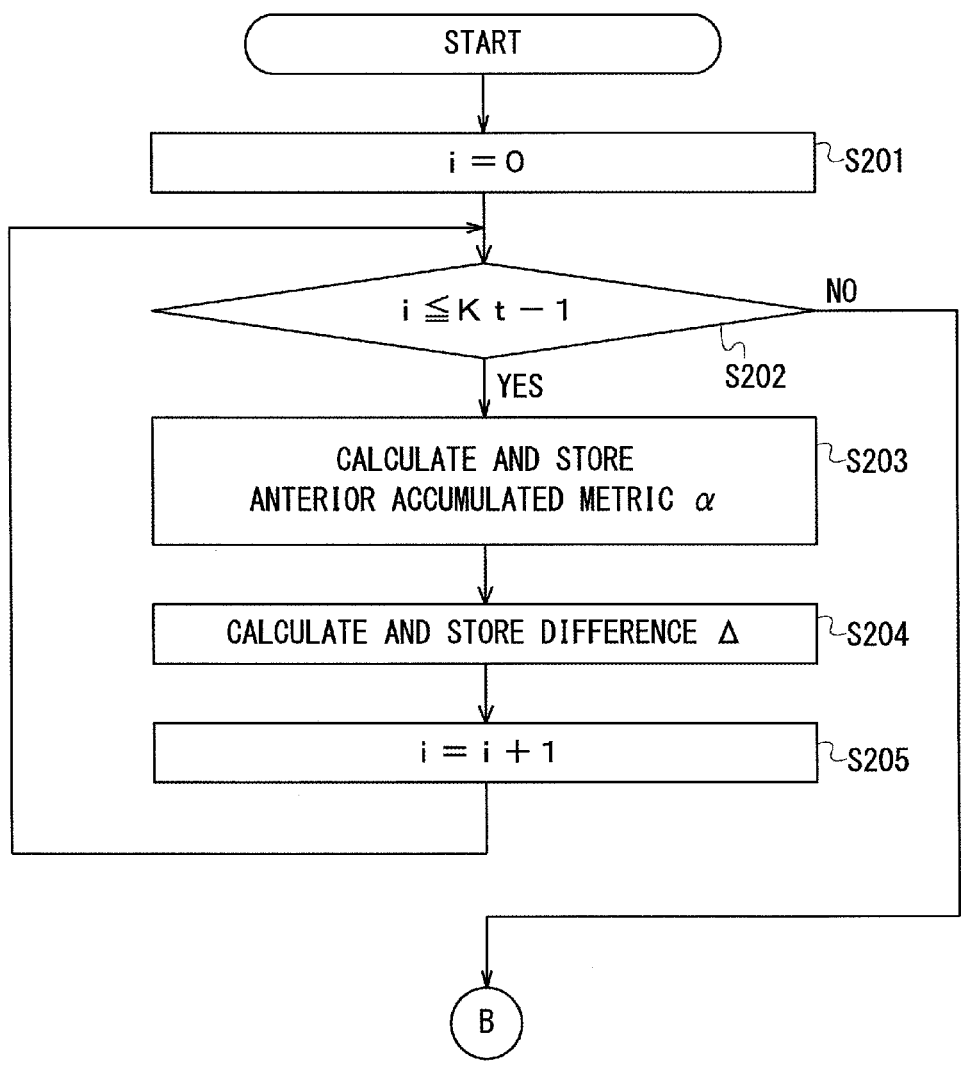
FIG. 16 is a diagram illustrating Example (1) of an operation flow of likelihood operations performed by the first element decoder 231 in Operation Example 2.
Figure 17:
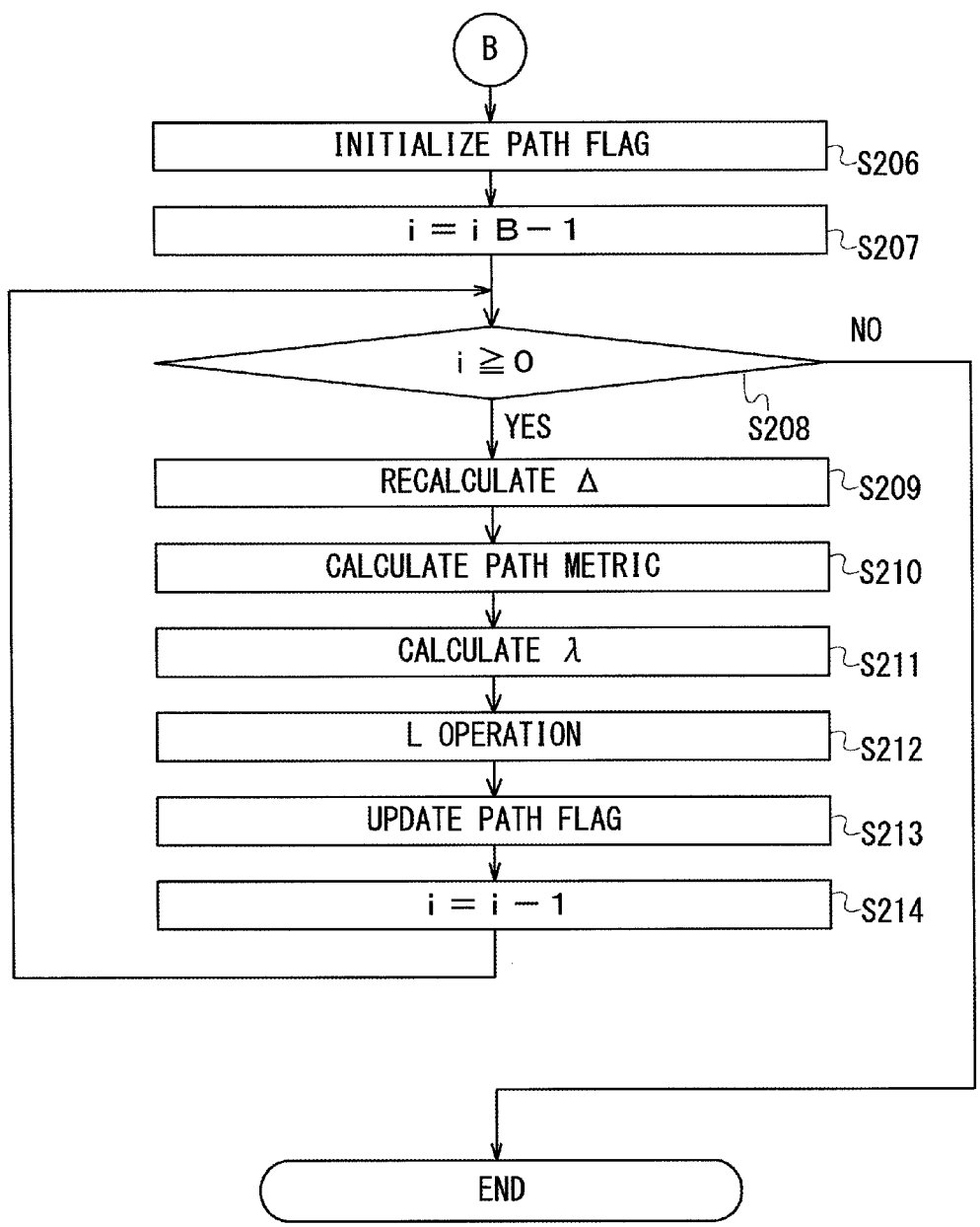
FIG. 17 is a diagram illustrating Example (2) of an operation flow of likelihood operations performed by the first element decoder 231 in Operation Example 2.

FIGS. 16 and 17 are diagrams illustrating examples of the operation flows of the likelihood operation performed by the first element decoder 231 in Operation Example 2. "B" in FIG. 16 is connected with "B" in FIG. 17.

The processes from step S201 to step S205 are processes in the anterior cumulative metric operation, namely the a operation. The processes from step S201 to step S205 correspond to the processes from step S101 to step S105 in Operation Example 1.

The processes from step S206 are processes in the posterior likelihood operation, namely the L operation. The maximum likelihood path is determined by tracing the winning paths from the end state s=0 at i=Kt−1 based on the flag information, namely the path selection flag. The flag information corresponding to the maximum likelihood path matches with the estimated bit (the hat of $u_i$).

In step S206, the first element decoder 231 initializes the path flag.

The first element decoder 231 calculates for each branch the branch metrics of branches from the termination point between i=Kt and i=Kt−m. m denotes the size of the delay memory. It is assumed here that m=3 and that the termination (trellis termination) is performed at the time t=Kt. Each path uniquely transiting from the state 0 at the time t=Kt to each state including state 0 to 7 can be traced in m (=3) steps from the termination point. The sum of the branch metrics of m(=3) branches from the termination point, which is state 0 at the time t=Kt, to each of $2^m$ states at the time t=Kt−m is defined as the value β for each state at the time t=Kt−m. The path from the state 0 at the time t=Kt to each state at the time t=Kt−m=K can be uniquely determined.

The first element decoder 231 traces back the surviving path as a candidate path at the starting point $t=i_B=K$ of the traceback. The path flag indicating whether or not a surviving path exists for the state s at the time $t=i$ is defined as $F_i(s)$. When $F_i(s)$ is 1, this means that a surviving path exists for the states at the time $t=i$. The path flag at the starting point $t=i_B$ of the traceback can be represented as follows. The first element decoder 231 stores the path flag in the memory.

$$F_{i_B}(s)=1 s=0,\ldots,7$$

That is, a surviving path exists for each state 0 to 7 at the time $t=i_B=K$. It is noted that $i_B=K=Kt-m$.

In addition, the metric for the maximum likelihood path among the paths which go through the state s at the time $t=i$ is $\lambda_i(s)=\alpha_i(s)+\beta_i(s)$. The first element decoder 231 calculates $\lambda_{iB}$ for each state at the time $t=I_B=K$. The first element decoder 231 calculates the minimum value of $\lambda_{iB}$ at the starting point $i_B$ of the traceback and determines the minimum value as $L_{min}$.

$$L_{min} = \min_s(\lambda_{i_B}(s)) = \min_s(\alpha_{i_B}(s) + \beta_{i_B}(s))$$

The traceback starts at the time $t=I_B$. $L_{min}$ is the path metric for the maximum likelihood path.

In step S207, the first element decoder 231 uses the variable i to assign $i_B-1$ to the variable i.

In step S208, the first element decoder 231 determines whether or not the variable i is equal to or larger than 0. When the variable i is equal to or larger than 0 (S208: Yes), the process proceeds to step S209. When the variable i is neither equal to nor larger than 0 (S208: No), the process is finished.

In step S209, the first element decoder 231 calculates the difference $\Delta_i$ of the likelihoods at the time $t=i$. The operations in step S209 are similar to the operations in step S108 in Operation Example 1.

In step S210, the first element decoder 231 uses the path flags to calculate for each branch the path metric $L_i$ of the maximum likelihood path among the paths which go through the branches between the time $t=i$ and the time $t=i+1$. That is, the first element decoder 231 calculates the metric $L_i$ of the maximum likelihood path among the paths which go through the state s' with the path flag $F_{i+1}(s')=1$.

The first element decoder 231 uses $\lambda_{i+1}(s')$ and the path selection information to calculate the metric for the maximum likelihood path among the paths including branches which transit from the state s at the time $t=i$ to the state s' at the time $t=i+1$. It is noted that the paths which go through the state s' with the path flag $F_{i+1}(s')=0$ at the time $t=i+1$ are not subject to the calculation. The path selection information for transiting from a state at the time $t=i$ to the state s' at the time $t=i+1$ can be obtained from the positive and negative of $\Delta_i(s')$. It is assumed here that the metric for the maximum likelihood path among the paths including branches which transit from the state s at the time $t=i$ to the state s' at the time $t=i+1$ is $L_i(s, s')$.

When $q_i(s'_k)=0$, the following formulas are obtained.

$$L_i(s_k,s_k)=\lambda_{i+1}(s'_k)+|\Delta_i(s'_k)|, L_i(s_{1-k},s'_k)=\lambda_{i+1}(s'_k)$$

In addition, when $q_i(s'_k)=1$, the following formulas are obtained.

$$L_i(s_k,s'_k)=\lambda_{i+1}(s'_k), L_i(s_{1-k},s'_k)=\lambda_{i+1}(s'_k)+|\Delta_i(s'_k)|$$

In this way, the first element decoder 231 calculates the path metric $L_i$ of the maximum likelihood path among the paths which go through branches which transit from the time $t=i$ to the time $t=i+1$. The calculated path metric $L_i$ is stored in the memory. It is noted that the path metric $L_i(s, s'_k)$ is not calculated when $\lambda_{i+1}(s'_k)$ does not exist. In addition, the path metric $L_i(s, s'_k)$ is not calculated when $F_{i+1}(s'_k)=0$. That is, the first element decoder 231 calculates the path metric for the maximum likelihood path with the value $L_{min}$ and the path metric for the path which loses against the maximum likelihood path after the time $t=i$.

In step S211, the first element decoder 231 uses the path metric $L_i$ to calculate $\lambda_i(s)$.

The first element decoder 231 uses $L_i$ to calculate $\lambda_i(s)$ for each state as described below. The calculated $\lambda_i(s)$ is stored in the memory. Thus, in a case in which the surviving paths are input into one state when the traceback is performed, the maximum likelihood path is selected from the surviving paths. The calculations correspond to the β operation.

$$\lambda_i(s_k)=\min(L_i(s_k,s'_0),L_i(s_k,s'_1))$$

When neither $L_i(s_k, s'_0)$ nor $L_i(s_k, s'_1)$ exists, $\lambda_i(s_k)$ is not calculated. In this case, $\lambda_i(s_k)$ does not exists in the memory.

In step S212, the first element decoder 231 uses the path metric $L_i$ to calculate the posterior likelihood $L(i)$.

The first element decoder 231 uses $L_i$ to calculate the posterior likelihood $L(i)$ at the time $t=i$ as described below. The calculated posterior likelihood $L(i)$ is stored in the memory.

$$L_{\hat{u}_i}(i)=L_{min}$$

$$L_b(i) = \min_{(s_1,s_2) \in B_b}(L_i(s_1,s_2)) \quad b=1-\hat{u}_i$$

$$L(i) = \frac{(L_1(i) - L_0(i))}{2}$$

b denotes a bit value 0 or 1. b is an inverted bit value, namely a rival bit value of the bit value of the maximum likelihood path at the time $t=i$. The maximum likelihood path among the paths with the path flag $F_{i+1}(s)=1$ which go through the state at the time $t=i+1$ is referred to as an SOVA basic path. Bb is a group of branches between the time $t=i$ and the time $t=i+1$ in relation to the paths with the input bit value b at the time $t=i$ among the SOVA basic paths. The group of branches is a group of branches in relation to rival paths for the maximum likelihood path. However, when the number of branches included in $B_b$ is smaller than a predetermined value $C_{st}$, branches of the paths (losing paths of losing paths) which lose at the time $t=i+1$ against the SOVA basic path with the input bit value 1-b at the time $t=i$ are added to $B_b$ until the number of branches included in $B_b$ reaches the predetermined value $C_{st}$. The branches to be added to $B_b$ can be arbitrarily selected from the branches of the paths (losing paths of losing paths) which lose at the time $t=i+1$ against the SOVA basic path with the input bit value 1-b at the time $t=i$. Consequently, the number of branches included in Bb becomes equal to or larger than the predetermined value $C_{st}$. That is, $L_b(i)$ is calculated by selecting a path with the maximum likelihood from the $C_{st}$ or more paths. The predetermined value $C_{st}$ can be determined according to the amount of operation processes and the performance of the simulation, for example. The predetermined value $C_{st}$ is 0 to 8 $(=2^m)$.

When the predetermined value $C_{st}$ is 0, the paths which lose against the SOVA basic path are not selected. Therefore, the path which is the most likelihood among the paths with the rival bit value of the input bit value of the maximum likelihood path at the time $t=i$ is selected based on the SOVA basic path. In addition, when the predetermined value $C_{st}$ is 8 $(=2^m)$, the paths which lose against the SOVA basic path are included in the selection. Therefore, the path which is the most likelihood among the paths with the rival bit value of the input bit value of the maximum likelihood path at the time t=i is selected based on the modified SOVA basic path.

The smaller L(i) is, the higher the probability that the value of the information bit of the branches at the time t=i is 0 is. $L_i$ ($s_1$, $s_2$) in the second formula of the above formulas at least includes the paths which lose against the maximum likelihood path at the time t=i+1.

In step S213, the first element decoder 231 updates the path flag. When $F_{i+1}$ (s')=1 and the path which goes through the branch ($s_k$, s') between the time t=i and the time t=i+1 is a path which wins against the paths which go through the branch ($s_{1-k}$, s'), the first element decoder 231 sets $F_i$ ($s_k$) to 1. Further, the first element decoder 231 sets $F_i$ to 0 in other cases.

In step S214, the first element decoder 231 assigns i−1 to the variable i and the process returns to step S208. When the variable i is smaller than 0 (S208: No), the process is finished.

In Operation Example 2, the SOVA scheme is incorporated into the Max-Log-MAP scheme to perform both the β operations and the L operations. In addition, in Operation Example 2, the operations equivalent to the β operations yield results similar to the Max-Log-MAP scheme. Further, in Operation Example, the amount of operations can be reduced by narrowing down the path candidates based on the SOVA basic path in the L operations.

In Operation Example 2, the path which is the most likelihood among the paths with the rival bit value of the input bit value of the maximum likelihoodpath at the time t=i is selected based on the path candidates which is surviving paths in the modified SOVA scheme. When the predetermined value $C_{st}$ becomes smaller than 8, the amount of calculations in the L operations can be reduced. In addition, when the predetermined value $C_{st}$ becomes larger than 0, the number of options for rival path in the L operations can be increased. As a result, the deterioration in the performance of the operations can be prevented.

Operation Example 3

Next, Operation Example 3 is described below. Operation Example 2 includes features in common with Operation Example 1 or 2. Therefore, the differences are mainly described and the detailed descriptions of the common features are omitted.

Although the predetermined value $C_{st}$ is a constant value, namely a fixed value in Operation Example 2. But, $C_{st}$ (i) which is a value dependent on the time t=i is introduced instead of the predetermined value $C_{st}$ in Operation Example 3.

$C_{st}$(i) at the time t=i is defined as follows.

$$C_{st}(i) = \begin{cases} C_1 & i \neq t_1 n \\ C_2 & i = t_1 n \end{cases} \quad n = 1, 2, \ldots$$

That is, the above $C_{st}$ is equal to $C_1$ in principle and becomes $C_2$ each time when the time $t_1$ elapses.

With this arrangement in Operation Example 3, the adjustment of the number of candidates for the selection of rival paths can be finer than the adjustment in which the predetermined value $C_{st}$ is changed by 1 as in Operation Example 2. For example, when the deterioration in performance is particularly eminent for $C_{st}$=4 in Operation Example 2, the number of candidates for the selection of rival path likely becomes four at each time. In this case, even when $C_{st}$ is set to 5, the improvement in performance may not be achieved. On the other hand, when $C_{st}$ is set to 4 in principle and set to 8 each time when the time 4 elapses, the number of bits which are used to select a higher likelihood path can be increased.

The turbo decoding processes are decoding processes for repeatedly feedback the posterior likelihood. Therefore, the larger the number of likelihoods is, the better the final performance is.

In addition, when $C_{st}$ is periodically changed as described above, the processes for changing the value of $C_{st}$ can be simpler than the processes for changing the value of $C_{st}$ randomly.

Functional Effects in Embodiment 1

When the first element decoder 231 calculates an anterior cumulative metric, the first element decoder 231 in the present embodiment stores the difference Δ of anterior cumulative metrics as data for recalculation in the memory. One difference Δ is stored for one butterfly. The differences Δ which are not stored in the memory can be calculated from the differences A stored in the memory. The positive and negative of the difference Δ represents the value of the estimated bit. Thus, when the first element decoder 231 uses the symmetry of local codes on branches included in the butterflies, the amount of operations, namely the amount of processes can be reduced in the first element decoder 231.

Here, the amount of operations performed by an element decoder. It is assumed that the addition and subtraction operation per one information bit and the comparison operation per one information bit are regarded a process with 1 weight. For example, in a Max-Log-MAP scheme, the addition and subtraction operation accounts for 19 weights and the comparison operation accounts for 8 weights in an α operation. In addition, the addition and subtraction operation accounts for 31 weights and the comparison operation accounts for 15 in the β operation and the L operation. Thus, the total weight is 72. On the other hand, in the present embodiment, the addition and subtraction operation accounts for 15 weights and the comparison operation accounts for 8 weights in an α operation. In addition, the addition and subtraction operation accounts for 15 weights and the comparison operation accounts for 13 in the L operation including an operation corresponding to the β operation. Thus, the total weight is 50. As a result, the amount of processes can be reduced by 31% (=1-50/72) in the present embodiment in comparison with the Max-Log-MAP scheme.

Figure 15:
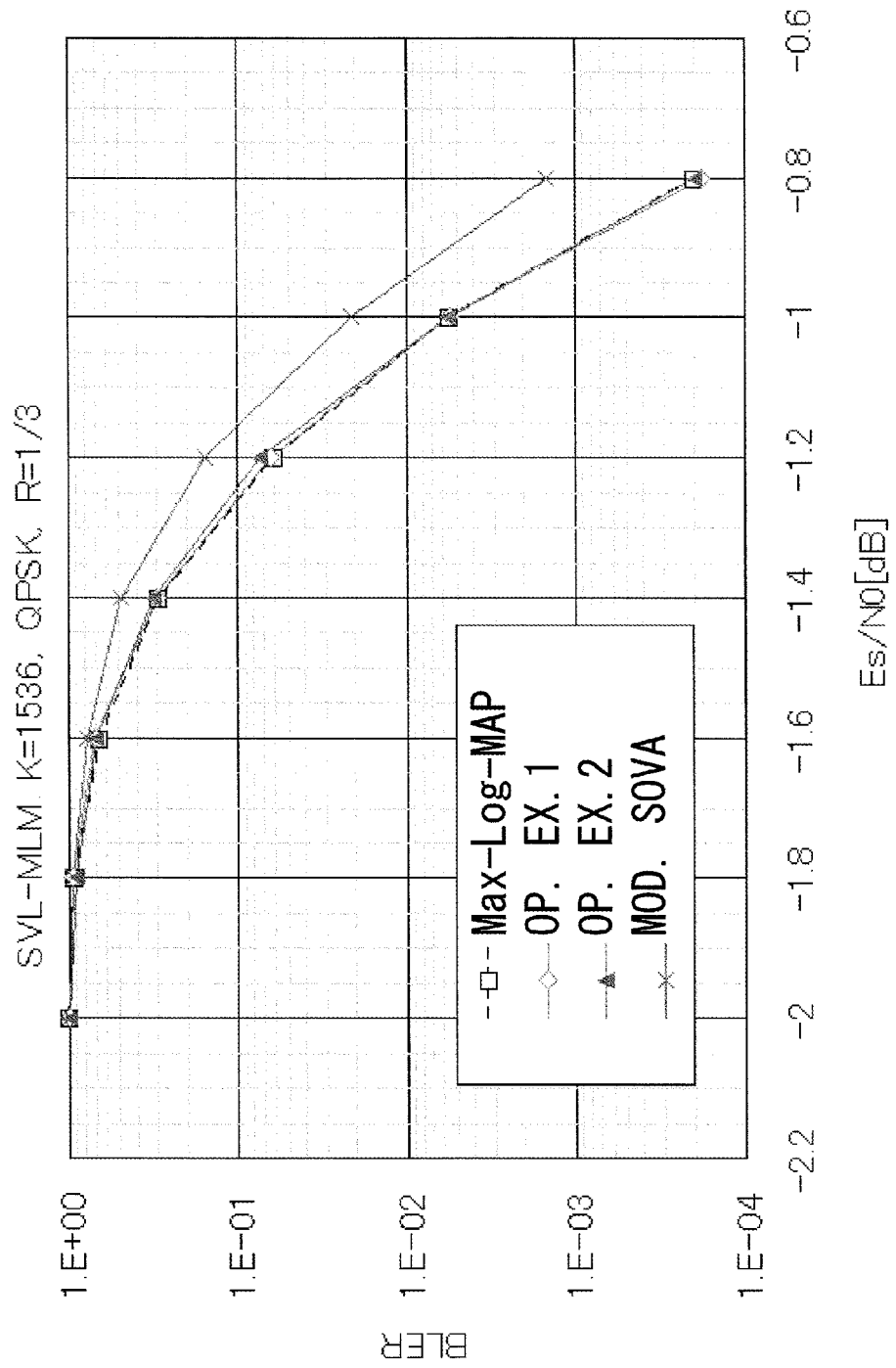
FIG. 15 is a diagram illustrating a simulation result.

FIG. 15 is a diagram illustrating examples of simulation results of the performance in the operations as described above. The horizontal axis in FIG. 15 represents the signal-to-noise power ratio. The vertical axis in FIG. 15 represents the logarithmic expression of BLER. FIG. 15 illustrates examples of simulation results of performance for the Max-Log-MAP scheme, the scheme according to Operation Example 1, the scheme according to Operation Example 2 and the modified SOVA scheme. FIG. 15 illustrates that a smaller BLER means a more accurate calculation. FIG. 15 illustrates that the performances according to the schemes in Operation Examples 1 and 2 are similar to the performance in the Max-Log-MAP scheme.

Thus, the performance achieved in the present embodiment is similar to the performance achieved in the Max-Log-MAP scheme. Further, the amount of operations can be reduced in the present embodiment in comparison with the Max-Log-MAP scheme.

Embodiment 2

Configuration Example

Next, Embodiment 2 is described below. Embodiment 2 includes features in common with Embodiment 1. Therefore, the differences are mainly described and the detailed descriptions of the common features are omitted.

In the present embodiment, the configurations in Embodiment 1 and the parallel MAP scheme are combined. In the present embodiment, the parallel number is M so that the input information bit sequence is divided into M pieces. The division of the information bit sequence is arranged to divide the sequence into pieces to be the similar in size. It is assumed here that the division number M is an aliquot part of the information bit sequence. A divided small block is referred to as sub-block. When the MAP for each sub-block is processed in parallel, the processing delay can be one-nth of the original delay and the process can be speeded up. In this case, when the MAP process is performed for each sub-block, the $\alpha$ operation and the $\beta$ operation are respectively started from a bit position in the middle of the process.

The configurations of the communication system according to the present embodiment are similar to the configurations according to Embodiment 1. The present embodiment differs from Embodiment 1 in the configurations of the first element decoder and the second element decoder in the decoding processing unit.

Figure 18:
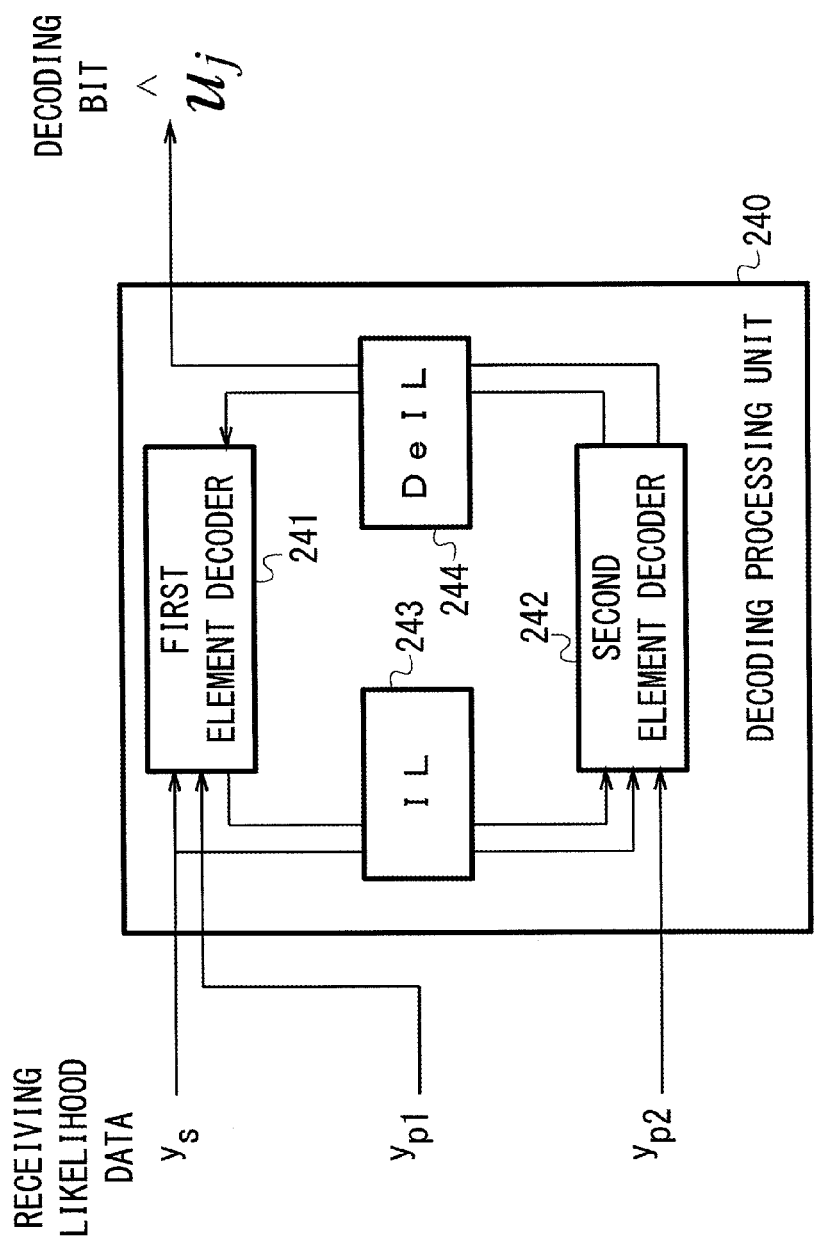
FIG. 18 is a diagram illustrating an example of a configuration of a decoding processing unit according to Embodiment 2.

FIG. 18 is a diagram illustrating a configuration example of the decoding processing unit. The decoding processing unit is indicated the numeral 240 in the present embodiment. The decoding processing unit 240 in FIG. 18 includes a first element decoder 241, a second element decoder 242, an interleaver (IL) 243 and a deinterleaver (DeIL) 244.

The first element decoder 241 uses likelihood data $y_s$, likelihood data $y_{p1}$ and data output from the second element decoder 242 etc. to calculate a decoding bit for each sub-block in parallel. The second element decoder 242 uses likelihood data $y_s$, likelihood data $y_{p2}$ and data output from the first element decoder 241 etc. to calculate a decoding bit for each sub-block in parallel. The interleaver 243 switches the sequence of the likelihood data $y_s$ and the data output from the first element decoder 241 and outputs the switched data to the second element decoder 242. The deinterleaver 244 switches the sequence of the data output from the second element decoder 242 and outputs the switched data to the first element decoder 241. In addition, the deinterleaver 244 switches the sequence of the data output from the second element decoder 242 and output the switched data as decoding bit. The configurations of the first element decoder 241 and the second element decoder 242 are similar to each other.

Figure 19:
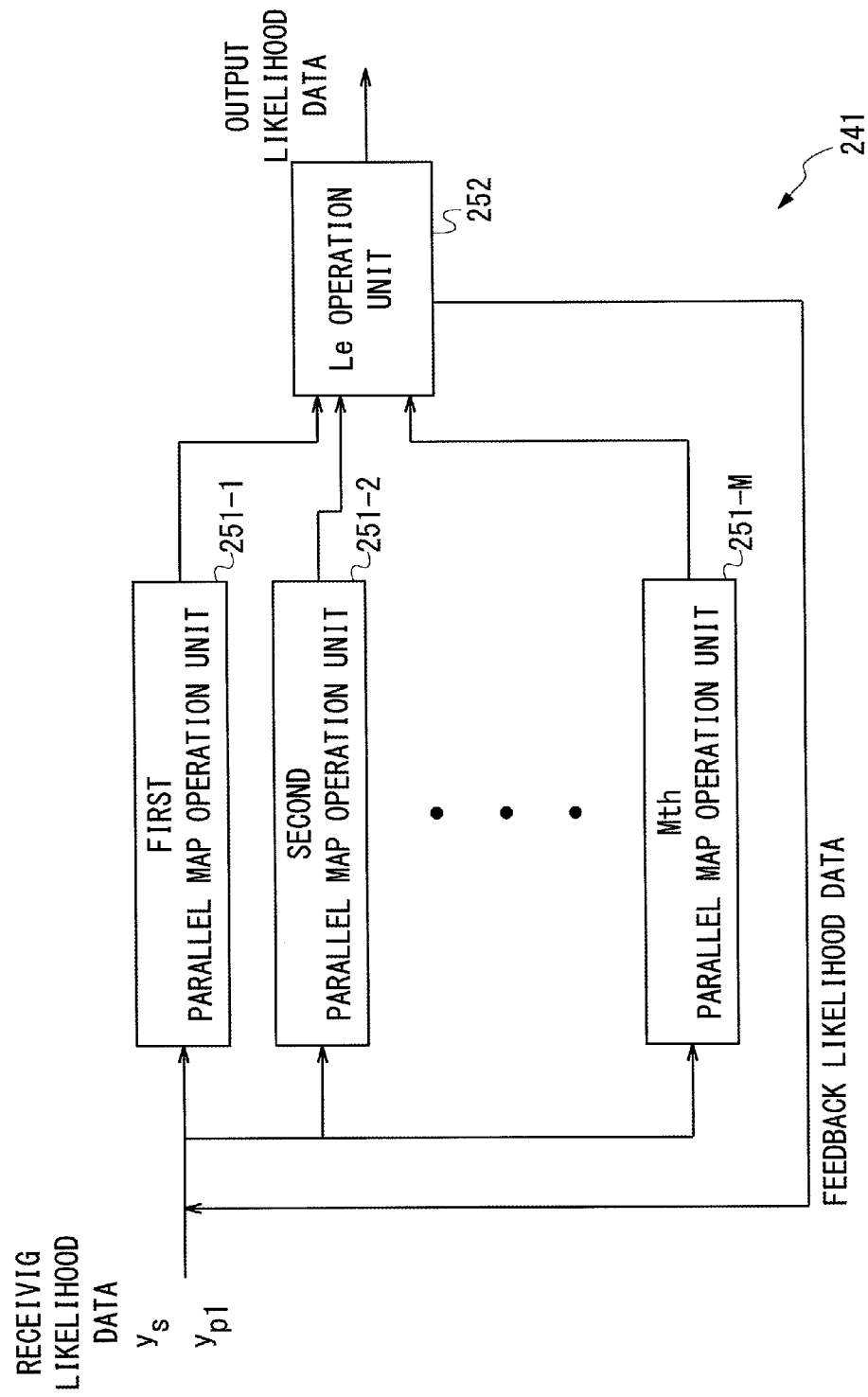
FIG. 19 is a diagram illustrating an example of a configuration of the first element decoder 241.

FIG. 19 is a diagram illustrating a configuration example of the first element decoder 241. The first element decoder 241 includes a first parallel MAP operation unit 251-1, a second parallel MAP operation unit 251-2, . . . , a Mth parallel MAP operation unit 251-M and an $L_e$ operation unit 252.

Each parallel MAP operation unit employs a similar configuration. In the following descriptions, each parallel MAP operation unit is represented by a parallel MAP operation unit 251.

The parallel MAP operation unit 251 employs a configuration similar to the first element decoder 231 in Embodiment 1. One of M sub-blocks into which an information bit sequence (likelihood data) is divided is input into the parallel MAP operation unit 251. Each sub-block can be input into the parallel MAP operation unit 251, which arbitrarily extracts data used for the operations. The parallel MAP operation unit 251 functions in a similar manner of the first element decoder 231 in Embodiment 1.

$L_e$ operation unit 252 uses path metrics calculated by the parallel MAP operation unit 251 to calculate L(i), which is the difference between the maximum likelihood path and the rival path. $L_e$ operation unit 252 outputs the calculated L(i) as feedback likelihood data or output likelihood data. The feedback likelihood data is input into the parallel MAP operation unit 251 as anterior likelihood. The output likelihood data is output to the second element decoder 242 etc.

Operation Example 4

Operation Example 4 includes features in common with Operation Examples 1 to 3 in Embodiment 1. Therefore, the differences are mainly described and the detailed descriptions of the common features are omitted.

When the parallel MAP operation unit 251 performs processes for each sub-block, the $\alpha$ operation and the $\beta$ operation are respectively started from a bit position in the middle of the processes. In this case, the anterior cumulative metric $\alpha$ and the posterior cumulative metric $\beta$ at the boundary of the sub-blocks which are next to each other are used. Similar to Embodiment 1, the anterior cumulative metric $\alpha$ and the posterior cumulative metric $\beta$ are obtained at the head and the tail of the information bit sequence. The parallel MAP operation unit 251 calculates as follows the anterior cumulative metric $\alpha$ and the posterior cumulative metric $\beta$ as initial values at the boundary of the sub-blocks which are next to each other.

(1) Training Method

In this method, the parallel MAP operation unit 251 calculates in the $\alpha$ operation or the $\beta$ operation an accumulated likelihood in a range from the boundary to the position a predetermined size away from the boundary. The parallel MAP operation unit 251 calculates the accumulated likelihood as the anterior cumulative metric $\alpha$ or the posterior cumulative metric $\beta$.

(2) Belief Propagation (BP) Method

In this method, the parallel MAP operation unit 251 stores an anterior cumulative metric $\alpha$ and a posterior cumulative metric $\beta$ at the boundary in the preceding repetition process. The parallel MAP operation unit 251 uses the stored anterior cumulative metric $\alpha$ and the stored posterior cumulative metric $\beta$ at the boundary as initial values at the boundary.

The path metric for the maximum likelihood path, namely the surviving path for each state at the boundary is calculated by calculating an initial value used for (1), (2) or the combination of (1) and (2) and calculating a sum of $\alpha$ and $\beta$. In addition, the parallel MAP operation unit 251 performs the operations by using the values of $\alpha$ and $\beta$ at the boundary in a similar manner as Embodiment 1.

Operation Example 5

Operation Example 5 includes features in common with Operation Examples 1 to 3 in Embodiment 1 and Operation Example 4. Therefore, the differences are mainly described and the detailed descriptions of the common features are omitted.

The initialization at the boundary, namely the initialization of path graph is performed in Operation Example 5 as described below.

It is assumed here that the number of surviving paths at the boundary is $N_b=2^{nb}$. The magnitude relation is determined between the pair of state values $(s_0, s_1)=(2k, 2k+1)$ regarding the metrics $\lambda_i(s)=\alpha_i(s)+\beta_i(s)$ (s=0, ..., 7) of the paths which can be traced back from each state. The path with a smaller metric is determined as a surviving path and is flagged with a path flag.

$$s(k) = \arg\min_{s=2k,2k+1}(\lambda_{i_B}(s))$$

When nb=2, a path flag is set to the surviving path as the initial state.

$$F_{i_B}(s(k))=1 \ k=0,1,2,3$$

When nb=1, the magnitude relation is further determined with a combination between k=0, 1 and K=2, 3. And then paths with smaller metrics are determined as surviving paths and the path flag is set to each path.

When nb=0, the magnitude relation is further determined for the remaining two paths which survive in the determination of the magnitude relation in the case of nb=1. And then the path with a smaller metric is determined as a surviving path. Consequently, this means that the state at the boundary from which the traceback is started for the maximum likelihood path is determined.

When the number of surviving paths at the boundary is decreased, the amount of operations can be reduced.

Functional Effects in Embodiment 2

The element decoder 241 in the present embodiment uses the parallel MAP operation unit 251 to perform the operations in parallel. Since the element decoder 241 performs decoding operations in parallel, the processing time can be shortened.

Although specific embodiments are described above, the configurations described and illustrated in each configuration example can be arbitrarily combined.

<<Computer Readable Recording Medium>>

It is possible to record a program which causes a computer to implement any of the functions described above on a computer readable recording medium. In addition, by causing the computer to read in the program from the recording medium and execute it, the function thereof can be provided.

The computer readable recording medium mentioned herein indicates a recording medium which stores information such as data and a program by an electric, magnetic, optical, mechanical, or chemical operation and allows the stored information to be read from the computer. Of such recording media, those detachable from the computer include, e.g., a flexible disk, a magneto-optical disk, a CD-ROM, a CD-R/W, a DVD, a DAT, an 8-mm tape, and a memory card. Of such recording media, those fixed to the computer include a hard disk and a ROM (Read Only Memory).

The technique disclosed according to the embodiments can reduce the deterioration of performance and reduce the amount of decoding processes.

All example and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A decoding apparatus to calculate a posterior likelihood at each instant of time between a starting time and an end time, the decoding apparatus comprising:
an operation unit to calculate a branch metric for a branch between a first instant of time and a second instant of time subsequent to the first instant of time based on receiving likelihood data and an anterior likelihood, and to use, in a state transition in a butterfly represented by a first state and a second state at the first instant of time and a third state and a fourth state at the second instant of time, a first anterior cumulative metric for the first state, a second anterior cumulative metric for the second state and a first difference based on the branch metric between the first state at the first instant of time and the third state at the second instant of time and on a second difference between the first anterior cumulative metric for the first state and the second anterior cumulative metric for the second state to calculate a third anterior cumulative metric for the third state and a fourth anterior cumulative metric for each butterfly and at each instant of time; and
a storage unit to store the second difference for each butterfly and at each instant of time.

2. The decoding apparatus according to claim 1, wherein the operation unit determines an anterior cumulative metric at the end time as a path metric for a maximum likelihood path, calculates for each state a path metric with a maximum likelihood at each instant of time based on the path metric for the maximum likelihood path and the second difference for each butterfly and at each instant of time, calculates an estimated bit of the maximum likelihood path based on the positive and negative of the second difference, and calculates at each instant of time a posterior likelihood based on the path metric for the maximum likelihood path and a path metric with a maximum likelihood among path metrics of paths which include an inverted bit of the estimated bit of the maximum likelihood path.

3. The decoding apparatus according to claim 1, wherein the operation unit determines an anterior cumulative metric at the end time as a path metric for a maximum likelihood path, calculates for each state a path metric with a maximum likelihood at each instant of time based on the path metric for the maximum likelihood path and the second difference for each butterfly and at each instant of time, calculates an estimated bit of the maximum likelihood path based on the positive and negative of the second difference, and calculates at each instant of time a posterior likelihood based on the path metric for the maximum likelihood path and a path metric with a maximum likelihood among path metrics of paths which include an inverted bit of the estimated bit of the maximum likelihood path and lose against the maximum likelihood path.

4. The decoding apparatus according to claim 3, wherein when the number of paths which include an inverted bit of the estimated bit of the maximum likelihood path and lose against the maximum likelihood path is smaller than a predetermined value, the operation unit extracts a path which includes an inverted bit of the estimated bit of the maximum likelihood path and loses against the maximum likelihood path until the number of paths reaches the predetermined value, and calculates the posterior likelihood based on the path metric for the extracted path and on the path metric for the maximum likelihood path and on the path metric with the maximum likelihood among the path metrics of the paths which lose against the maximum likelihood path.

5. The decoding apparatus according to claim 4, wherein the predetermine value is variable at each instant of time.

6. The decoding apparatus according to claim 4, wherein the predetermine value is variable on a periodic basis.

7. A decoding method performed by a decoding apparatus which includes a storage unit and calculates a posterior likelihood at each instant of time between a starting time and an end time, the decoding method comprising:

calculating a branch metric for a branch between a first instant of time and a second instant of time subsequent to the first instant of time based on receiving likelihood data and an anterior likelihood, and to use, in a state transition in a butterfly represented by a first state and a second state at the first instant of time and a third state and a fourth state at the second instant of time, a first anterior cumulative metric for the first state, a second anterior cumulative metric for the second state and a first difference based on the branch metric between the first state at the first instant of time and the third state at the second instant of time andona second difference between the first anterior cumulative metric for the first state and the second anterior cumulative metric for the second state to calculate a third anterior cumulative metric for the third state and a fourth anterior cumulative metric for each butterfly and at each instant of time; and storing the second difference for each butterfly and at each instant of time in the storage unit.

8. The decoding method according to claim 7, wherein an anterior cumulative metric at the end time is determined as a path metric for a maximum likelihood path, a path metric with a maximum likelihood is calculated for each state at each instant of time based on the path metric for the maximum likelihood path and the second difference for each butterfly and at each instant of time, an estimated bit of the maximum likelihood path is calculated based on the positive and negative of the second difference, and a posterior likelihood is calculated at each instant of time based on the path metric for the maximum likelihood path and a path metric with a maximum likelihood among path metrics of paths which include an inverted bit of the estimated bit of the maximum likelihood path.

9. The decoding method according to claim 7, wherein an anterior cumulative metric at the end time is determined as a path metric for a maximum likelihood path, a path metric with a maximum likelihood at each instant of time is calculated for each state based on the path metric for the maximum likelihood path and the second difference for each butterfly and at each instant of time, an estimated bit of the maximum likelihood path is calculated based on the positive and negative of the second difference, and a posterior likelihood is calculated at each instant of time based on the path metric for the maximum likelihood path and a path metric with a maximum likelihood among path metrics of paths which include an inverted bit of the estimated bit of the maximum likelihood path and lose against the maximum likelihood path.

10. The decoding method according to claim 9, wherein when the number of paths which include an inverted bit of the estimated bit of the maximum likelihood path and lose against the maximum likelihood path is smaller than a predetermined value, a path which includes an inverted bit of the estimated bit of the maximum likelihood path and loses against the maximum likelihood path is extracted until the number of paths reaches the predetermined value, and the posterior likelihood is calculated based on the path metric for the extracted path and on the path metric for the maximum likelihood path and on the path metric with the maximum likelihood among the path metrics of the paths which lose against the maximum likelihood path.

11. The decoding method according to claim 10, wherein the predetermine value is variable at each instant of time.

12. The decoding method according to claim 10, wherein the predetermine value is variable on a periodic basis.

* * * * *